United States Patent
Breil et al.

(10) Patent No.: US 12,550,416 B2
(45) Date of Patent: Feb. 10, 2026

(54) CONTACT FORMATION PROCESS FOR CMOS DEVICES

(71) Applicant: Applied Materials, Inc., Santa Clara, CA (US)

(72) Inventors: Nicolas Louis Breil, San Jose, CA (US); Lisa Mcgill, Hillsboro, OR (US); Amritha Rammohan, Santa Clara, CA (US); Shashank Sharma, Fremont, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 366 days.

(21) Appl. No.: 18/206,042

(22) Filed: Jun. 5, 2023

(65) Prior Publication Data
US 2024/0014075 A1 Jan. 11, 2024

Related U.S. Application Data

(60) Provisional application No. 63/359,728, filed on Jul. 8, 2022.

(51) Int. Cl.
*H10D 84/03* (2025.01)
*H01L 21/02* (2006.01)
(Continued)

(52) U.S. Cl.
CPC ..... *H10D 84/038* (2025.01); *H01L 21/02063* (2013.01); *H01L 21/28518* (2013.01);
(Continued)

(58) Field of Classification Search
CPC ............. H10D 84/038; H10D 84/0186; H10D 84/017; H01L 21/02063; H01L 21/28518;
(Continued)

(56) References Cited

U.S. PATENT DOCUMENTS

2009/0159932 A1  6/2009  Pinto et al.
2015/0021696 A1  1/2015  Sung et al.
(Continued)

FOREIGN PATENT DOCUMENTS

CN    108630533 A    10/2018

OTHER PUBLICATIONS

International Search Report and Written Opinion dated Sep. 22, 2023 for Application No. PCT/US2023/024454.

*Primary Examiner* — Thanhha S Pham
(74) *Attorney, Agent, or Firm* — Patterson + Sheridan, LLP

(57) ABSTRACT

A method of forming an electrical contact in a semiconductor structure includes performing a patterning process to form a mask on a semiconductor structure, the semiconductor structure comprising a first semiconductor region, a second semiconductor region, a dielectric layer having a first opening over the first semiconductor region and a second opening over the second semiconductor region, wherein the mask covers an exposed surface of the second semiconductor region within the second opening, performing an amorphization ion implant process to amorphize an exposed surface of the first semiconductor region within the first opening, performing a removal process to remove the mask, performing a selective epitaxial deposition process, to epitaxially form a contact layer on the exposed surface of the second semiconductor region, and performing a recrystallization anneal process to recrystallize the amorphized surface of the first semiconductor region.

7 Claims, 14 Drawing Sheets

(51) Int. Cl.
  *H01L 21/285* (2006.01)
  *H01L 21/768* (2006.01)
  *H10D 84/01* (2025.01)

(52) U.S. Cl.
  CPC .. *H01L 21/76805* (2013.01); *H01L 21/76814* (2013.01); *H01L 21/76843* (2013.01); *H01L 21/76889* (2013.01); *H01L 21/76895* (2013.01); *H10D 84/0186* (2025.01)

(58) Field of Classification Search
  CPC ......... H01L 21/76805; H01L 21/76814; H01L 21/76843; H01L 21/76889; H01L 21/76895; H01L 21/76804; H01L 21/76849; H01L 21/28525
  See application file for complete search history.

(56) References Cited

U.S. PATENT DOCUMENTS

| | | | |
|---|---|---|---|
| 2018/0277483 A1* | 9/2018 | Gluschenkov | .... H01L 21/76877 |
| 2021/0119033 A1 | 4/2021 | Chien et al. | |
| 2021/0272955 A1 | 9/2021 | More et al. | |

* cited by examiner

CONTACT FORMATION PROCESS FOR CMOS DEVICES

CROSS-REFERENCE TO RELATED APPLICATIONS

This application claims priority to U.S. Provisional Application Ser. No. 63/359,728 filed Jul. 8, 2022, which is herein incorporated by reference in its entirety.

BACKGROUND

Field

Embodiments described herein generally relate to semiconductor device fabrication, and more particularly, to systems and methods of forming a contact within a semiconductor structure.

Description of the Related Art

Multi-gate metal-oxide-semiconductor field-effect transistors (MOSFETs), such as complementary metal-oxide semiconductor (CMOS) devices, pose challenges in manufacturability due to their three-dimensional (3D) designs and small sizes. In advanced CMOS devices, an epitaxial layer of silicon-containing material (e.g., boron-doped p-type silicon germanium or phosphorus-doped n-type silicon) formed at a bottom of a trench contact is often utilized to lower a contact resistivity into the $10^{-9}$ $\Omega \cdot cm^2$ regime, and achieve the required performance for advanced CMOS technologies.

However, the formation and patterning of such epitaxial layers, for example, using a hard mask to protect an n-MOS region or a p-MOS region, may damage various portions of the CMOS device, such as spacers, gate cap layers, or epitaxially grown layers.

Therefore, there is a need for methods and systems that can form a contact that includes an epitaxial layer of silicon-containing material at a selected portion of a semiconductor device.

SUMMARY

Embodiments of the present disclosure provide a method of forming an electrical contact in a semiconductor structure. The method includes performing a patterning process to form a mask on a semiconductor structure, the semiconductor structure comprising a first semiconductor region, a second semiconductor region, a dielectric layer having a first opening over the first semiconductor region and a second opening over the second semiconductor region, wherein the mask covers an exposed surface of the second semiconductor region within the second opening, performing an amorphization ion implant process to amorphize an exposed surface of the first semiconductor region within the first opening, performing a removal process to remove the mask, performing a selective epitaxial deposition process, to epitaxially form a contact layer on the exposed surface of the second semiconductor region, and performing a recrystallization anneal process to recrystallize the amorphized surface of the first semiconductor region.

Embodiments of the present disclosure provide a method of forming an electrical contact in a semiconductor structure. The method includes performing an amorphization ion implant process on a semiconductor structure, the semiconductor structure comprising a first semiconductor region, a second semiconductor region, a dielectric layer having a first opening over the first semiconductor region and a second opening over the second semiconductor region, to amorphize an exposed surface of the first semiconductor region within the first opening and an exposed surface of the second semiconductor region within the second opening, performing a selective epitaxial deposition process, to epitaxially form a contact layer on the exposed surface of the second semiconductor region, and performing a recrystallization anneal process to recrystallize the amorphized surface of the first semiconductor region.

Embodiments of the present disclosure provide a method of forming an electrical contact in a semiconductor structure. The method includes performing a patterning process to form a mask on a semiconductor structure, the semiconductor structure comprising a first semiconductor region, a second semiconductor region, a dielectric layer having a first opening over the first semiconductor region and a second opening over the second semiconductor region, wherein the mask covers an exposed surface of the second semiconductor region within the second opening, performing an oxidation process to oxidize an exposed surface of the first semiconductor region within the first opening, performing a removal process to remove the mask, and performing a selective epitaxial deposition process, to epitaxially form a contact layer on the exposed surface of the second semiconductor region.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

The embodiments described herein provide methods and systems for forming a contact that includes an epitaxial layer of silicon-containing material (e.g., boron-doped p-type silicon germanium or phosphorus-doped n-type silicon) at a selected portion (e.g., on an exposed surface of a layer of silicon or silicon germanium) of a structure that is used to form a CMOS device. The methods and systems may be particularly useful for forming, in a semiconductor structure having a region that includes silicon, a region that includes silicon germanium, and a dielectric layer formed thereover, an epitaxial layer that includes silicon germanium selectively on an exposed surface of the silicon germanium material within an opening or feature (e.g., contact trench) formed in the dielectric layer. Unlike conventional processes that require the formation of a hard mask and various etching and patterning process steps, which tend to damage the fabricated semiconductor structures (e.g., spacers, gate cap, etc.), to form a contact, the processes described herein are configured to form a contact without damaging these previously formed semiconductor structures.

Figure 1:
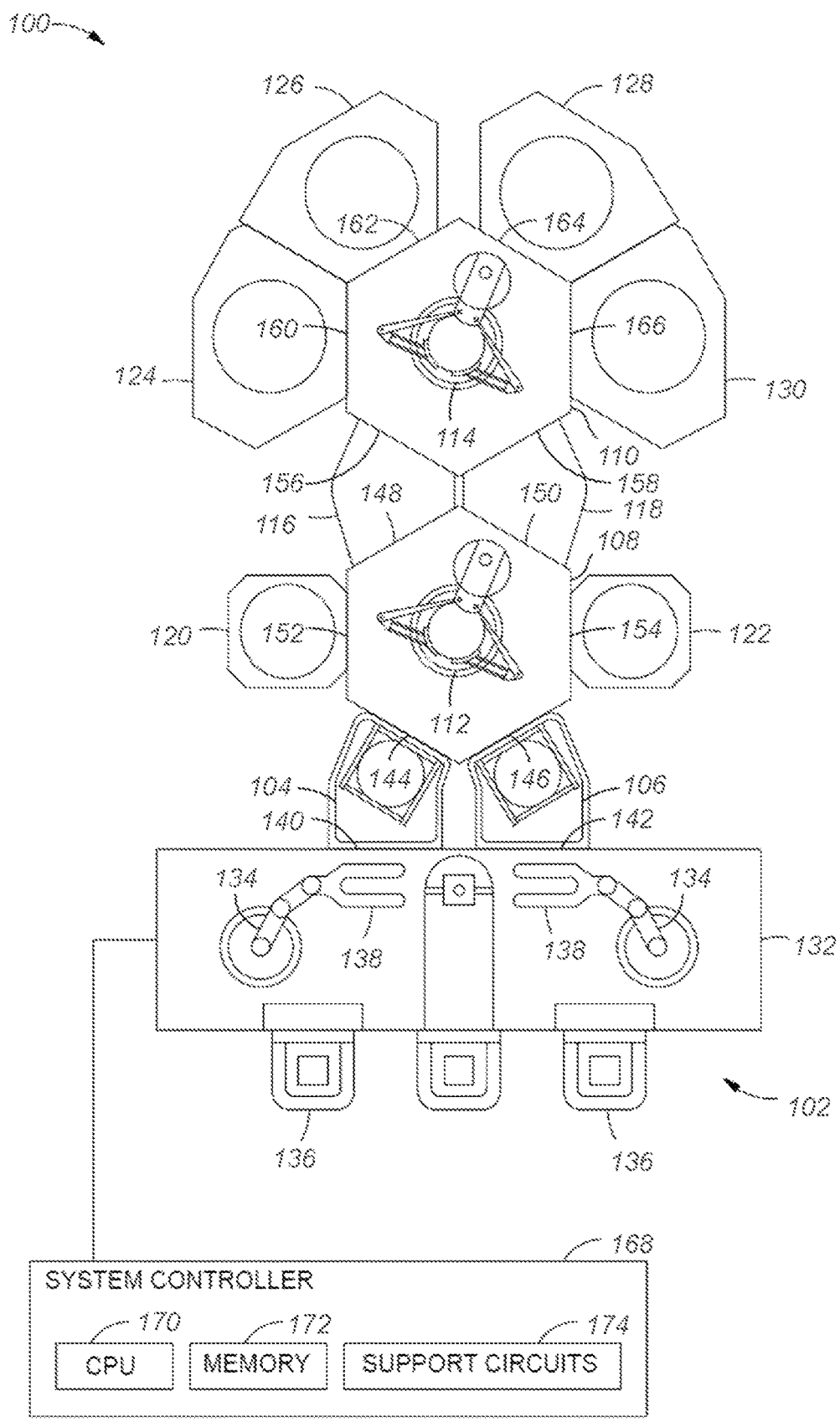
FIG. 1 is a schematic top view of a multi-chamber processing system according to one or more embodiments of the present disclosure.

FIG. 1 is a schematic top view of a multi-chamber processing system 100, according to one or more embodiments of the present disclosure. The processing system 100 generally includes a factory interface 102, load lock chambers 104, 106, transfer chambers 108, 110 with respective transfer robots 112, 114, holding chambers 116, 118, and processing chambers 120, 122, 124, 126, 128, 130. As detailed herein, substrates in the processing system 100 can be processed in and transferred between the various chambers without exposing the substrates to an ambient environment exterior to the processing system 100 (e.g., an atmospheric ambient environment such as may be present in a fab). For example, the substrates can be processed in and transferred between the various chambers maintained at a low pressure (e.g., less than or equal to about 300 Torr) or vacuum environment without breaking the low pressure or vacuum environment among various processes performed on the substrates in the processing system 100. Accordingly, the processing system 100 may provide for an integrated solution for some processing of substrates.

Examples of a processing system that may be suitably modified in accordance with the teachings provided herein include the Endura®, Producer® or Centura® integrated processing systems or other suitable processing systems commercially available from Applied Materials, Inc., located in Santa Clara, California. It is contemplated that other processing systems (including those from other manufacturers) may be adapted to benefit from aspects described herein.

In the illustrated example of FIG. 1, the factory interface 102 includes a docking station 132 and factory interface robots 134 to facilitate transfer of substrates. The docking station 132 is adapted to accept one or more front opening unified pods (FOUPs) 136. In some examples, each factory interface robot 134 generally includes a blade 138 disposed on one end of the respective factory interface robot 134 adapted to transfer the substrates from the factory interface 102 to the load lock chambers 104, 106.

The load lock chambers 104, 106 have respective ports 140, 142 coupled to the factory interface 102 and respective ports 144, 146 coupled to the transfer chamber 108. The transfer chamber 108 further has respective ports 148, 150 coupled to the holding chambers 116, 118 and respective ports 152, 154 coupled to processing chambers 120, 122. Similarly, the transfer chamber 110 has respective ports 156, 158 coupled to the holding chambers 116, 118 and respective ports 160, 162, 164, 166 coupled to processing chambers 124, 126, 128, 130. The ports 144, 146, 148, 150, 152, 154, 156, 158, 160, 162, 164, 166 can be, for example, slit valve openings with slit valves for passing substrates therethrough by the transfer robots 112, 114 and for providing a seal between respective chambers to prevent a gas from passing between the respective chambers. Generally, any port is open for transferring a substrate therethrough. Otherwise, the port is closed.

The load lock chambers 104, 106, transfer chambers 108, 110, holding chambers 116, 118, and processing chambers 120, 122, 124, 126, 128, 130 may be fluidly coupled to a gas and pressure control system (not specifically illustrated). The gas and pressure control system can include one or more gas pumps (e.g., turbo pumps, cryo-pumps, roughing pumps), gas sources, various valves, and conduits fluidly coupled to the various chambers. In operation, a factory interface robot 134 transfers a substrate from a FOUP 136 through a port 140 or 142 to a load lock chamber 104 or 106. The gas and pressure control system then pumps down the load lock chamber 104 or 106. The gas and pressure control system further maintains the transfer chambers 108, 110 and holding chambers 116, 118 with an interior low pressure or vacuum environment (which may include an inert gas). Hence, the pumping down of the load lock chamber 104 or 106 facilitates passing the substrate between, for example, the atmospheric environment of the factory interface 102 and the low pressure or vacuum environment of the transfer chamber 108.

With the substrate in the load lock chamber 104 or 106 that has been pumped down, the transfer robot 112 transfers the substrate from the load lock chamber 104 or 106 into the transfer chamber 108 through the port 144 or 146. The transfer robot 112 is then capable of transferring the substrate to and/or between any of the processing chambers 120, 122 through the respective ports 152, 154 for processing and the holding chambers 116, 118 through the respective ports 148, 150 for holding to await further transfer. Similarly, the transfer robot 114 is capable of accessing the substrate in the holding chamber 116 or 118 through the port 156 or 158 and is capable of transferring the substrate to and/or between any of the processing chambers 124, 126, 128, 130 through the respective ports 160, 162, 164, 166 for processing and the holding chambers 116, 118 through the respective ports 156, 158 for holding to await further transfer. The transfer and holding of the substrate within and among the various chambers can be in the low pressure or vacuum environment provided by the gas and pressure control system.

The processing chambers 120, 122, 124, 126, 128, 130 can be any appropriate chamber for processing a substrate. In some examples, the processing chamber 120 can be capable of performing an etch process, the processing chamber 122 can be capable of performing a cleaning process, the processing chamber 124 can be capable of performing a selective removal process, and the processing chambers 126, 128, 130 can be capable of performing respective epitaxial growth processes. The processing chamber 120 may be a Selectra™ Etch chamber available from Applied Materials of Santa Clara, Calif. The processing chamber 122 may be a SiCoNi™ Pre-clean chamber available from Applied Materials of Santa Clara, Calif. The processing chamber 126, 128, or 130 may be a Centura™ Epi chamber available from Applied Materials of Santa Clara, Calif.

A system controller 168 is coupled to the processing system 100 for controlling the processing system 100 or components thereof. For example, the system controller 168 may control the operation of the processing system 100 using a direct control of the chambers 104, 106, 108, 110, 116, 118, 120, 122, 124, 126, 128, 130 of the processing system 100 or by controlling controllers associated with the chambers 104, 106, 108, 110, 116, 118, 120, 122, 124, 126, 128, 130. In operation, the system controller 168 enables data collection and feedback from the respective chambers to coordinate performance of the processing system 100.

The system controller 168 generally includes a central processing unit (CPU) 170, memory 172, and support circuits 174. The CPU 170 may be one of any form of a general purpose processor that can be used in an industrial setting. The memory 172, or non-transitory computer-readable medium, is accessible by the CPU 170 and may be one or more of memory such as random access memory (RAM), read only memory (ROM), floppy disk, hard disk, or any other form of digital storage, local or remote. The support circuits 174 are coupled to the CPU 170 and may comprise cache, clock circuits, input/output subsystems, power supplies, and the like. The various methods disclosed herein may generally be implemented under the control of the CPU 170 by the CPU 170 executing computer instruction code stored in the memory 172 (or in memory of a particular processing chamber) as, for example, a software routine. When the computer instruction code is executed by the CPU 170, the CPU 170 controls the chambers to perform processes in accordance with the various methods.

Other processing systems can be in other configurations. For example, more or fewer processing chambers may be coupled to a transfer apparatus. In the illustrated example, the transfer apparatus includes the transfer chambers 108, 110 and the holding chambers 116, 118. In other examples, more or fewer transfer chambers (e.g., one transfer chamber) and/or more or fewer holding chambers (e.g., no holding chambers) may be implemented as a transfer apparatus in a processing system.

Figure 2A:
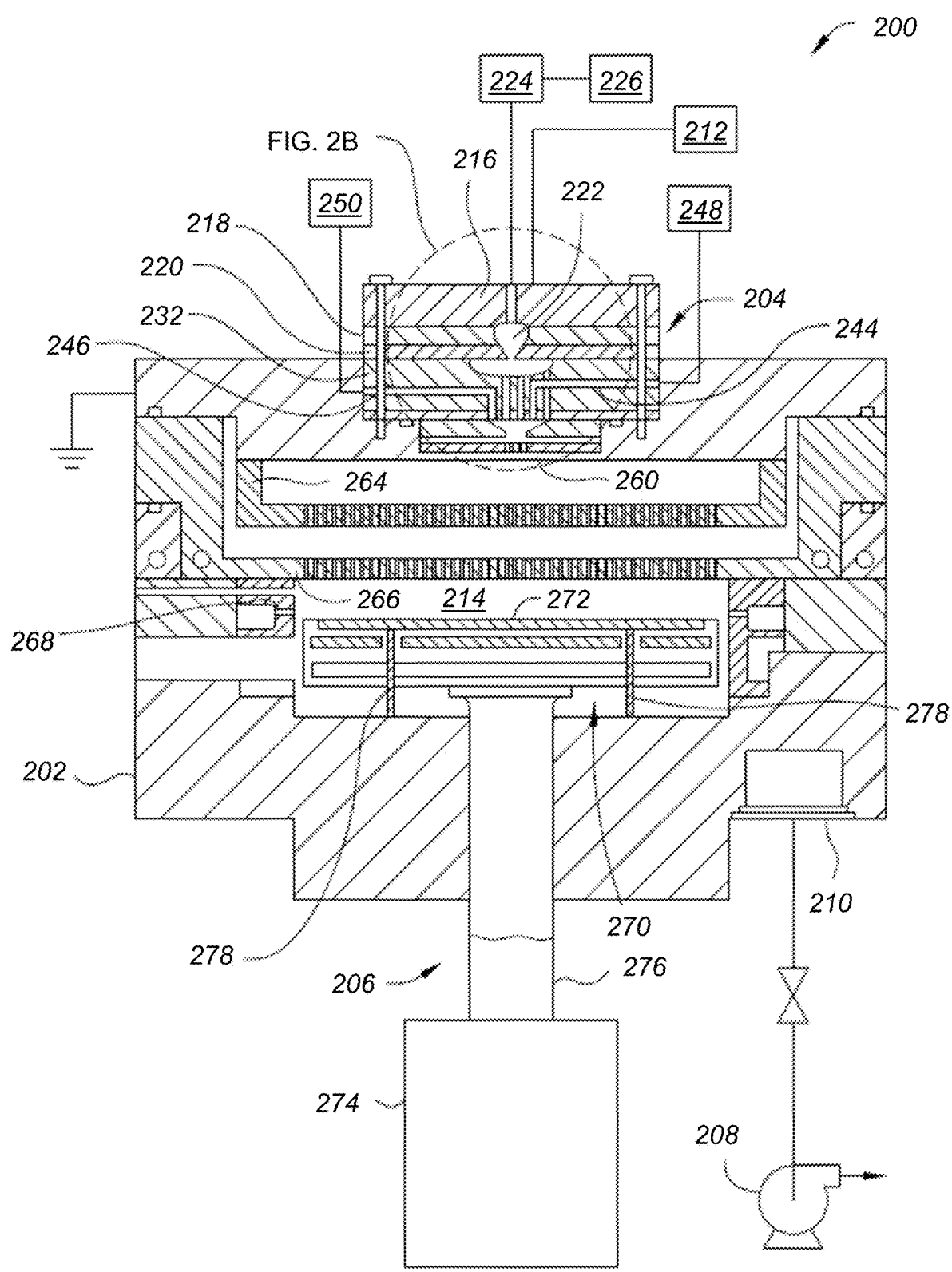
FIG. 2A is a cross sectional view of a processing chamber, according to one or more embodiments.
Figure 2B:
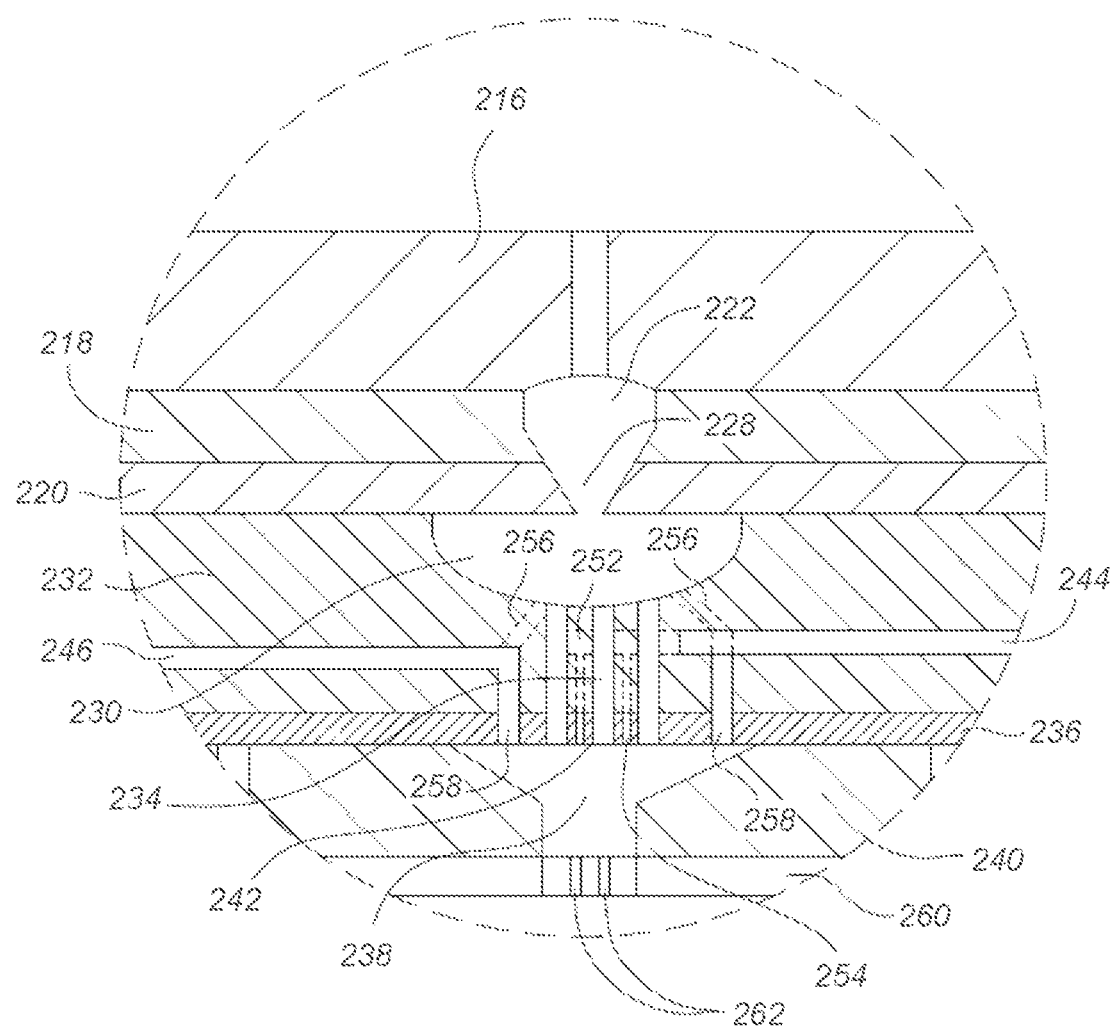
FIG. 2B is an enlarged view of a portion of the processing chamber of FIG. 2A.

FIG. 2A is a cross sectional view of a processing chamber 200, according to one or more embodiments, that is adapted to perform a pre-clean process as detailed below. The processing chamber 200 may be the processing chamber 122 shown in FIG. 1. FIG. 2B is an enlarged view of a portion of the processing chamber 200 of FIG. 2A.

The processing chamber 200 may be particularly useful for performing a thermal or plasma-based cleaning process and/or a plasma assisted dry etch process. The processing chamber 200 includes a chamber body 202, a lid assembly 204, and a support assembly 206. The lid assembly 204 is disposed at an upper end of the chamber body 202, and the support assembly 206 is at least partially disposed within the chamber body 202. A vacuum system can be used to remove gases from processing chamber 200. The vacuum system includes a vacuum pump 208 coupled to a vacuum port 210 disposed in the chamber body 202. The processing chamber 200 also includes a controller 212 for controlling processes within the processing chamber 200.

The lid assembly 204 includes stacked components adapted to provide precursor gases and/or a plasma to a processing region 214 within the processing chamber 200. A first plate 216 is coupled to a second plate 218. A third plate 220 is coupled to the second plate 218. The lid assembly 204 may be connected to a power source (not shown) for supplying a plasma to a cone-shaped chamber 222 formed in the lid assembly 204. The lid assembly 204 can also be connected to a remote plasma source 224 that creates the plasma upstream of the lid stack. The remote plasma cavity (e.g., the processing region 214, the first plate 216, and the second plate 218 in FIGS. 2A-2B) is coupled to a gas source 226 via the remote plasma source 224 (or the gas source 226 is coupled directly to the lid assembly 204 in the absence of the remote plasma source 224). The gas source 226 may include a gas source that is adapted to provide helium, argon, or other inert gas. In some configurations, the gas provided by the gas source 226 can be energized into a plasma that is provided to the lid assembly 204 by use of the remote plasma source 224. In alternate embodiments, the gas source 226 may provide process gases that can be activated by the remote plasma source 224 prior to being introduced to a surface of the substrate that is disposed within the processing chamber 200. Referring to FIG. 2B, the cone-shaped chamber 222 has an opening 228 that allows a formed plasma to flow from the remote plasma source 224 to a volume 230 formed in a fourth plate 232 of the lid assembly 204.

In some configurations of the lid assembly 204, a plasma is generated within the cone-shaped chamber 222 by the application of energy delivered from a plasma source. In one example, the energy can be provided by biasing the lid assembly 204 to capacitively couple RF, VHF and/or UHF energy to the gases positioned in the cone-shaped chamber 222. In this configuration of the lid assembly 204, the remote plasma source 224 may not be used, or not be installed within the lid assembly 204.

A central conduit 234, which is formed in the fourth plate 232, is adapted to provide the plasma generated species provided from the volume 230 through a fifth plate 236 to a mixing chamber 238 formed in a sixth plate 240 of the lid assembly 204. The central conduit 234 communicates with the mixing chamber 238 through an opening 242 in the fifth plate 236. The opening 242 may have a diameter less than, greater than or the same as a diameter of the central conduit 234. In the embodiment of FIG. 2B, the opening 242 has diameter the same as the central conduit 234.

The fourth plate 232 also includes inlets 244 and 246 that are adapted to provide gases to the mixing chamber 238. The inlet 244 is coupled to a first gas source 248 and the inlet 246 is coupled to a second gas source 250. The first gas source 248 and the second gas source 250 may include processing gases as well as inert gases, for example inert gases such as argon and/or helium, utilized as a carrier gas. The first gas source 248 may include ammonia ($NH_3$) as well as argon (Ar). The second gas source 250 may contain fluorine containing gases, hydrogen containing gases, or a combination thereof. In one example, the second gas source 250 may contain hydrogen fluoride (HF) as well as argon (Ar).

As illustrated in FIG. 2B, in some configurations, the inlet 244 is coupled to the mixing chamber 238 through a cylindrical channel 252 (shown in phantom) and holes 254 formed in the fifth plate 236. The inlet 246 is coupled to the mixing chamber 238 through a cylindrical channel 256 (shown in phantom) and holes 258 formed in the fifth plate 236. The holes 254, 258 formed in the fifth plate 236 are generally sized so that they enable a uniform flow of gases, which are provided from their respective gas source 248, 250, into the mixing chamber 238. In one configuration, the holes 258 have a diameter that is less than a width of the opening defined by the opposing sidewalls of the cylindrical channel 256 formed in the fourth plate 232. The holes 258 are typically distributed around the circumference of the center-line of the cylindrical channel 256 to provide uniform fluid flow into the mixing chamber 238. In one configuration, the holes 254 have a diameter that is less than a width of the opening defined by the opposing sidewalls of the cylindrical channel 252 formed the fourth plate 232. The holes 254 are typically distributed around the circumference of the center-line of the cylindrical channel 252 to provide uniform fluid flow into the mixing chamber 238.

The inlets 244 and 246 provide respective fluid flow paths laterally through the fourth plate 232, turning toward and penetrating through the fifth plate 236 to the mixing chamber 238. The lid assembly 204 also includes a seventh plate or first gas distributor 260, which may be a gas distribution plate, such as a showerhead, where the various gases mixed in the lid assembly 204 are flowed through perforations 262 formed therein. The perforations 262 are in fluid communication with the mixing chamber 238 to provide flow pathways from the mixing chamber 238 through the first gas distributor 260. Referring back to FIG. 2A, a blocker plate 264 and a gas distribution plate, such as a second gas distributor 266, which may be a gas distribution plate, such as a showerhead, is disposed below the lid assembly 204.

Alternatively, a different cleaning process may be utilized to clean the substrate surface. For example, a remote plasma containing helium (He) and ammonia ($NH_3$) may be introduced into the processing chamber 200 through the lid assembly 204, while ammonia ($NH_3$) may be directly injected into the processing chamber 200 via a separate gas inlet 268 that is disposed at a side of the chamber body 202 and coupled to a gas source (not shown).

The support assembly 206 may include a substrate support 270 to support a substrate 272 thereon during processing. The substrate support 270 may be coupled to an actuator 274 by a shaft 276 which extends through a centrally-located opening formed in a bottom of the chamber body 202. The actuator 274 may be flexibly sealed to the chamber body 202 by bellows (not shown) that prevent vacuum leakage around the shaft 276. The actuator 274 allows the substrate support 270 to be moved vertically within the chamber body 202 between a processing position and a loading position. The loading position is slightly below the opening of a tunnel (not shown) formed in a sidewall of the chamber body 202.

The substrate support 270 has a flat, or a substantially flat, substrate supporting surface for supporting a substrate 272 to be processed thereon. The substrate support 270 may be moved vertically within the chamber body 202 by the actuator 274, which is coupled to the substrate support 270 by the shaft 276. For some process operations, the substrate support 270 may be elevated to a position in close proximity to the lid assembly 204 to control the temperature of the substrate 272 being processed. As such, the substrate 272 may be heated via radiation emitted from the second gas distributor 266, or another radiant source, or by convection or conduction from the second gas distributor 266 through an intervening gas. In some process steps, the substrate may be disposed on lift pins 278 to perform additional thermal processing operations, such as performing an annealing step.

Figure 3:
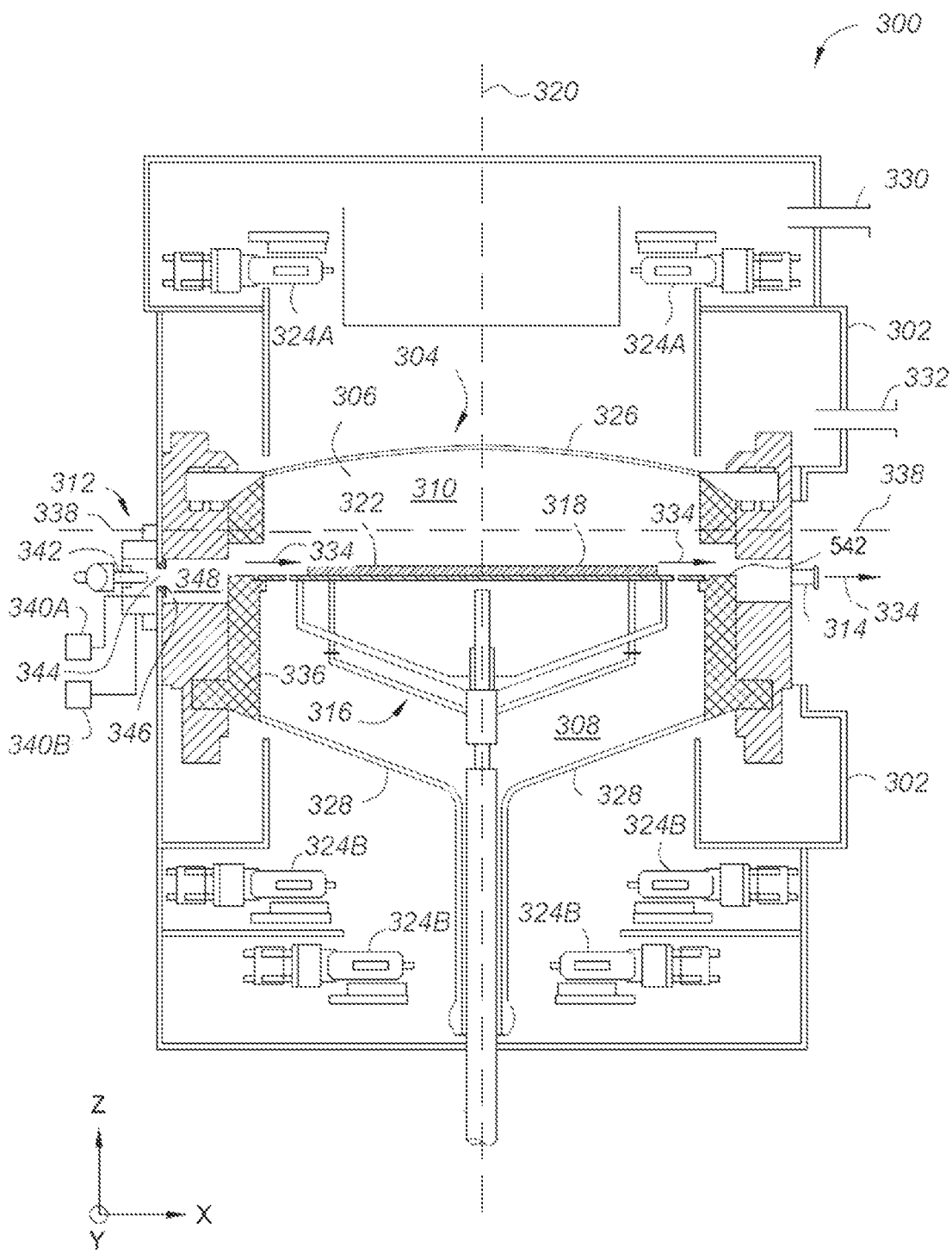
FIG. 3 is a cross sectional view of a processing chamber, according to one or more embodiments.

FIG. 3 is a cross sectional view of a processing chamber 300, according to one or more embodiments, that is adapted to perform an epitaxial (Epi) deposition process as detailed below. The processing chamber 300 may be the processing chamber 126, 128, or 130 shown in FIG. 1.

The processing chamber 300 includes a housing structure 302 made of a process resistant material, such as aluminum or stainless steel, for example 316L stainless steel. The housing structure 302 encloses various functioning elements of the processing chamber 300, such as a quartz chamber 304, which includes an upper quartz chamber 306, and a lower quartz chamber 308, in which a processing volume 310 is contained. Reactive species are provided to the quartz chamber 304 by a gas distribution assembly 312, and processing byproducts are removed from the processing volume 310 by an outlet port 314, which is typically in communication with a vacuum source (not shown).

A substrate support 316 is adapted to receive a substrate 318 that is transferred to the processing volume 310. The substrate support 316 is disposed along a longitudinal axis 320 of the processing chamber 300. The substrate support 316 may be made of a ceramic material or a graphite material coated with a silicon material, such as silicon carbide, or other process resistant material. Reactive species from precursor reactant materials are applied to a surface 322 of the substrate 318, and byproducts may be subsequently removed from the surface 322 of the substrate 318. Heating of the substrate 318 and/or the processing volume 310 may be provided by radiation sources, such as upper lamp modules 324A and lower lamp modules 324B.

In one embodiment, the upper lamp modules 324A and the lower lamp modules 324B are infrared (IR) lamps. Non-thermal energy or radiation from the lamp modules 324A and 324B travels through an upper quartz window 326 of the upper quartz chamber 306, and through a lower quartz window 328 of the lower quartz chamber 308. Cooling gases for the upper quartz chamber 306, if needed, enter through an inlet 330 and exit through an outlet 332. Precursor reactant materials, as well as diluent, purge and vent gases for the processing chamber 300, enter through the gas distribution assembly 312 and exit through the outlet port 314. While the upper quartz window 326 is shown as being curved or convex, the upper quartz window 326 may be planar or concave as the pressure on both sides of the upper quartz window 326 is substantially the same (i.e., atmospheric pressure).

The low wavelength radiation in the processing volume 310, which is used to energize reactive species and assist in adsorption of reactants and desorption of process byproducts from the surface 322 of the substrate 318, typically ranges from about 0.8 µm to about 1.2 µm, for example, between about 0.95 µm to about 1.05 µm, with combinations of various wavelengths being provided, depending, for example, on the composition of the film which is being epitaxially grown.

The component gases enter the processing volume 310 via the gas distribution assembly 312. Gas flows from the gas distribution assembly 312 and exits through the outlet port 314 as shown generally by a flow path 334. Combinations of component gases, which are used to clean/passivate a substrate surface, or to form the silicon and/or germanium-containing film that is being epitaxially grown, are typically mixed prior to entry into the processing volume 310. The overall pressure in the processing volume 310 may be adjusted by a valve (not shown) on the outlet port 314. At least a portion of the interior surface of the processing volume 310 is covered by a liner 336. In one embodiment, the liner 336 comprises a quartz material that is opaque. In this manner, the chamber wall is insulated from the heat in the processing volume 310.

The temperature of surfaces in the processing volume 310 may be controlled within a temperature range of about 200° C. to about 600° C., or greater, by the flow of a cooling gas, which enters through the inlet 330 and exits through the outlet 332, in combination with radiation from the upper lamp modules 324A positioned above the upper quartz window 326. The temperature in the lower quartz chamber 308 may be controlled within a temperature range of about 200° C. to about 600° C. or greater, by adjusting the speed of a blower unit which is not shown, and by radiation from the lower lamp modules 324B disposed below the lower quartz chamber 308. The pressure in the processing volume 310 may be between about 0.1 Torr to about 600 Torr, such as between about 5 Torr to about 30 Torr.

The temperature on the surface 322 of the substrate 318 may be controlled by power adjustment to the lower lamp modules 324B in the lower quartz chamber 308, or by power adjustment to both the upper lamp modules 324A overlying the upper quartz window 326, and the lower lamp modules 324B in the lower quartz chamber 308. The power density in the processing volume 310 may be between about 40 $W/cm^2$ to about 400 $W/cm^2$, such as about 80 $W/cm^2$ to about 120 $W/cm^2$.

In one aspect, the gas distribution assembly 312 is disposed normal to, or in a radial direction 338 relative to, the longitudinal axis 320 of the processing chamber 300 or the substrate 318. In this orientation, the gas distribution assembly 312 is adapted to flow process gases in the radial direction 338 across, or parallel to, the surface 322 of the substrate 318. In one processing application, the process gases are preheated at the point of introduction to the processing chamber 300 to initiate preheating of the gases prior to introduction to the processing volume 310, and/or to break specific bonds in the gases. In this manner, surface reaction kinetics may be modified independently from the thermal temperature of the substrate 318.

In operation, precursors used to form silicon (Si) and silicon germanium (SiGe) blanket or selective epitaxial films are provided to the gas distribution assembly 312 from one or more gas sources 340A and 340B. IR lamps 342 (only one is shown in FIG. 3) may be utilized to heat the precursors within the gas distribution assembly 312 as well as along the flow path 334. The gas sources 340A, 340B may be coupled the gas distribution assembly 312 in a manner adapted to facilitate introduction zones within the gas distribution assembly 312, such as a radial outer zone and a radial inner zone between the outer zones when viewed in from a top plan view. The gas sources 340A, 340B may include valves (not shown) to control the rate of introduction into the zones.

The gas sources 340A, 340B may include silicon precursors such as silanes, including silane ($SiH_4$), disilane ($Si_2H_6$), dichlorosilane ($SiH_2Cl_2$), hexachlorodisilane ($Si_2Cl_6$), dibromosilane ($SiH_2Br_2$), higher order silanes, derivatives thereof, and combinations thereof. The gas sources 340A, 340B may also include germanium containing precursors, such as germane ($GeH_4$), digermane ($Ge_2H_6$), germanium tetrachloride ($GeCl_4$), dichlorogermane ($GeH_2Cl_2$), derivatives thereof, and combinations thereof. The silicon and/or germanium containing precursors may be used in combination with hydrogen chloride (HCl), chlorine gas ($Cl_2$), hydrogen bromide (HBr), and combinations thereof. The gas sources 340A, 340B may include one or more of the silicon and germanium containing precursors in one or both of the gas sources 340A, 340B.

The precursor materials enter the processing volume 310 through openings or holes 344 (only one is shown in FIG. 3) in the perforated plate 346 in this excited state, which in one embodiment is a quartz material, having the holes 344 formed therethrough. The perforated plate 346 is transparent to IR energy, and may be made of a clear quartz material. In other embodiments, the perforated plate 346 may be any material that is transparent to IR energy and is resistant to process chemistry and other processing chemistries. The energized precursor materials flow toward the processing volume 310 through the holes 344 in the perforated plate 346, and through channels 348 (only one is shown in FIG. 3). A portion of the photons and non-thermal energy from the IR lamps 342 also passes through the holes 344, the perforated plate 346, and channels 348 facilitated by a reflective material and/or surface disposed on the interior surfaces of the gas distribution assembly 312, thereby illuminating the flow path 334 of the precursor materials. In this manner, the vibrational energy of the precursor materials may be maintained from the point of introduction to the processing volume 310 along the flow path.

Figure 4:
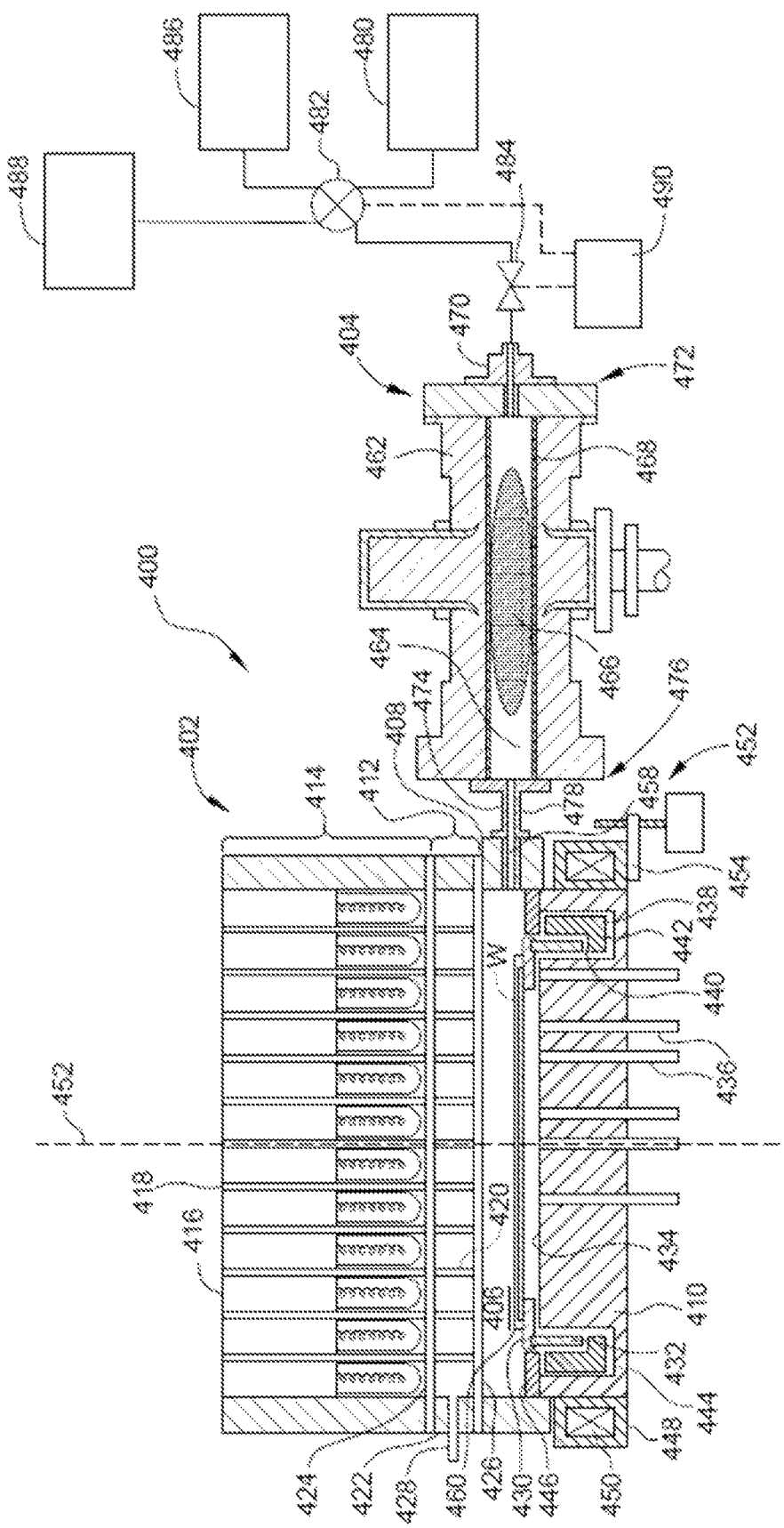
FIG. 4 is a cross sectional view of a processing system, according to one or more embodiments.

FIG. 4 is a cross sectional view of a processing system 400, according to one or more embodiments, that is adapted to perform a recrystallization anneal or an oxidation process as detailed below. The processing system 400 may be a rapid thermal processing (RTP) apparatus, such as, but not limited to, RTP CENTURA® available from Applied Materials, Inc., of Santa Clara, Calif. Other types of thermal reactors, such as EPI CENTURA® available from Applied Materials, Inc., of Santa Clara, Calif., may be substituted for the RTP apparatus. Other suitable plasma reactors, including Remote Plasma Oxidation (RPO) reactors available from Applied Materials, Inc., of Santa Clara, Calif., may also be utilized.

The processing system 400 includes a thermal processing chamber 402 and a precursor activator 404 that couples to the thermal processing chamber 402 and is used to remotely provide radicals of a plasma to a processing region 406 of the thermal processing chamber 402. The precursor activator 404 can also be used to provide an activated plasma gas mixture, for example by applying energy to a gas that makes a high radical rich mixture with negligible ions. The processing region 406 is enclosed by one or more sidewalls 408 (e.g., four sidewalls) and a base 410. The upper portion of the sidewall 408 may be sealed to a window assembly 412 (e.g., using "O" rings). A radiant energy assembly 414 is positioned over and coupled to window assembly 412. The radiant energy assembly 414 has a plurality of lamps 416, which may be tungsten halogen lamps, each mounted into a receptacle 418 and positioned to emit electromagnetic radiation into the processing region 406. The window assembly 412 of FIG. 4 has a plurality of light pipes 420, but the window assembly 412 may just have a flat, solid window with no light pipes. The window assembly 412 has an outer wall 422 (e.g., a cylindrical outer wall) that forms a rim enclosing the window assembly 412 around a circumference thereof. The window assembly 412 also has a first window 424 covering a first end of the plurality of light pipes 420 and a second window 426 covering a second end of the plurality of light pipes 420, opposite the first end. The first window 424 and second window 426 extend to, and engage with, the outer wall 422 of the window assembly 412 to enclose and seal the interior of the window assembly 412, which includes the plurality of light pipes 420. In such cases, when light pipes are used, a vacuum can be produced in the plurality of light pipes 420 by applying vacuum through a conduit 428 through the outer wall 422 to one of the plurality of light pipes 420, which is in turn fluidly connected to the rest of the light pipes.

A substrate W is supported in the thermal processing chamber 402 by a support ring 430 within the processing region 406. The support ring 430 is mounted on a rotatable cylinder 432. By rotating the rotatable cylinder 432, the support ring 430 and substrate W are caused to rotate during processing. The base 410 of the thermal processing chamber 402 has a reflective surface 434 for reflecting energy onto the backside of the substrate W during processing. Alternatively, a separate reflector (not shown) can be positioned between the base 410 of the thermal processing chamber 402 and the support ring 430. The thermal processing chamber 402 may include a plurality of temperature probes 436 disposed through the base 410 of the thermal processing chamber 402 to detect the temperature of the substrate W. In the event a separate reflector is used, as described above, the temperature probes 436 are also disposed through the separate reflector for optical access to electromagnetic radiation coming from the substrate W.

The rotatable cylinder 432 is supported by a magnetic rotor 438, which is a cylindrical member having a ledge 440 on which the rotatable cylinder 432 rests when both members are installed in the thermal processing chamber 402. The magnetic rotor 438 has a plurality of magnets in a magnet region 442 below the ledge 440. The magnetic rotor 438 is disposed in an annular well 444 located at a peripheral region of the thermal processing chamber 402 along the base 410. A cover 446 rests on a peripheral portion of the base 410 and extends over the annular well 444 toward the rotatable cylinder 432 and support ring 430, leaving a tolerance gap between the cover 446 and the rotatable cylinder 432 and/or the support ring 430. The cover 446 generally protects the magnetic rotor 438 from exposure to process conditions in the processing region 406.

The magnetic rotor 438 is rotated by magnetic energy from a magnetic stator 448 disposed around the base 410. The magnetic stator 448 has a plurality of electromagnets 450 that, during processing of the substrate W, are powered according to a rotating pattern to form a rotating magnetic field that provides magnetic energy to rotate the magnetic rotor 438. The magnetic stator 448 is coupled to a linear actuator 452 by a support 454. Operating the linear actuator 452 moves the magnetic stator 448 along an axis 456 of the thermal processing chamber 402, which in turn moves the magnetic rotor 438, the rotatable cylinder 432, the support ring 430, and the substrate W along the axis 456.

Processing gas is provided to the thermal processing chamber 402 through a chamber inlet 458, and exhausts through a chamber outlet oriented out of the page and generally along the same plane as the chamber inlet 458 and the support ring 430 (not shown in FIG. 4). Substrates enter and exit the thermal processing chamber 402 through an access port 460 formed in the sidewall 408 and shown at the rear in FIG. 4.

The precursor activator 404 has a body 462 surrounding an interior space 464 where a plasma 466 of ions, radicals, and electrons can be formed. A liner 468 made of quartz or sapphire protects the body 462 from chemical attack by the plasma. The interior space 464 preferably does not have any electrical potential gradient present that might attract charged particles, e.g., ions. A gas inlet 470 is disposed at a first end 472 of the body 462 and opposite from a gas outlet 474 that is located at a second end 476 of the body 462. When the precursor activator 404 is coupled to the thermal processing chamber 402, the gas outlet 474 is in fluid communication with the thermal processing chamber 402 through a delivery line 478 to chamber inlet 458, such that radicals of the plasma 466 generated within the interior space 464 are supplied to the processing region 406 of the thermal processing chamber 402. The gas outlet 474 may have a diameter larger than the gas inlet 470 to allow the excited radicals to be efficiently discharged at a targeted flow rate, and to minimize the contact between the radicals and the liner 468. If targeted, a separate orifice may be inserted within the liner 468 at the gas outlet 474 to reduce an inner dimension of the interior space 464 at the gas outlet 474. The diameter of the gas outlet 474 (or orifice, if used) can be selected to provide a pressure differential between the processing region 406 and the precursor activator 404. The pressure differential may be selected to yield a composition of ions, radicals, and molecules flowing into the thermal processing chamber 402 that is suitable to processes being performed in the thermal processing chamber 402.

To provide gas for plasma processing, a first gas source 480 is coupled to the gas inlet 470 via a first input of a four-way valve 482 and a valve 484 used to control the flow rate of gas released from the first gas source 480. A second input of the four-way valve 482 may be coupled to a second gas source 486. A third input of the four-way valve may be coupled to a third gas source 488. Each of the first gas source 480, the second gas source 486, and the third gas source 488 may be, or include, one or more of a nitrogen-containing gas, an oxygen-containing gas, a silicon-containing gas, a hydrogen-containing gas, or a plasma forming gas such as argon or helium. A flow controller 490 is connected to the four-way valve 482 to switch the valve between its different positions, depending upon which process is to be carried out. The flow controller 490 also controls switching of the four-way valve 482.

In some implementations, a second hydrogen gas source (not shown) is fluidly coupled with the thermal processing chamber 402. The second hydrogen gas source delivers hydrogen gas to the processing region 406 where the hydrogen gas is activated by the remote plasma comprising oxygen and argon delivered from the precursor activator 404 to the processing region 406. In some implementations where a high percentage of hydrogen gas is targeted, hydrogen gas may be supplied to the processing region 406 through both the third gas source 488 and the second hydrogen gas source.

In some implementations, a second argon gas source (not shown) is coupled with the thermal processing chamber 402. The second argon gas source delivers argon gas to the processing region 406 where the argon gas is activated by the remote plasma delivered from the precursor activator 404 to the processing region 406. In some implementations where a high percentage of argon gas is targeted, argon gas may be supplied to the processing region 406 through both the second gas source 486 and the second argon gas source.

Figure 5:
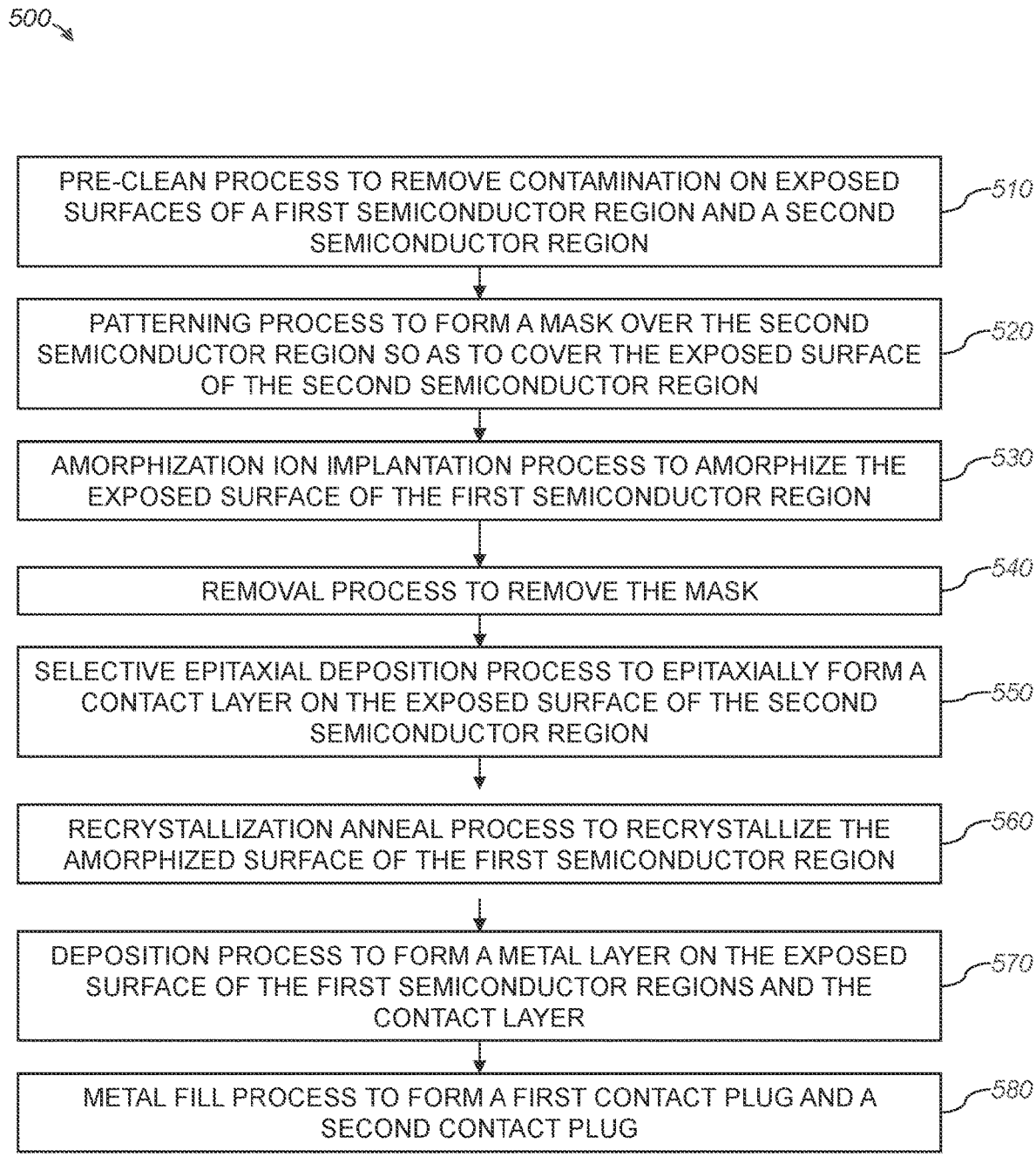
FIG. 5 depicts a process flow diagram of a method of forming a contact layer in a semiconductor structure according to a first embodiment of the present disclosure.

FIG. 5 depicts a process flow diagram of a method 500 of forming a contact layer in a semiconductor structure 600 according to a first embodiment of the present disclosure. FIGS. 6A, 6B, 6C, 6D, 6E, 6F, 6G, and 6H are cross-sectional views of a portion of the semiconductor structure 600 corresponding to various states of the method 500. It should be understood that FIGS. 6A, 6B, 6C, 6D, 6E, 6F, 6G, and 6H illustrate only partial schematic views of the semiconductor structure 600, and the semiconductor structure 600 may contain any number of transistor sections and additional materials having aspects as illustrated in the figures. It should also be noted that although the method illustrated in FIG. 5 is described sequentially, other process sequences that include one or more operations that have been omitted and/or added, and/or has been rearranged in another desirable order, fall within the scope of the embodiments of the disclosure provided herein.

Referring to FIGS. 6A, 6B, 6C, 6D, 6E, 6F, 6G, and 6H, the semiconductor structure 600 may include a first transistor device 602 and a second transistor device 604 formed on a substrate (not shown).

The term "substrate" as used herein refers to a layer of material that serves as a basis for subsequent processing operations and includes a surface to be cleaned. The substrate may be a silicon based material or any suitable insulating materials or conductive materials as needed. The substrate may include a material such as crystalline silicon (e.g., Si<100> or Si<111>), silicon oxide, strained silicon, silicon germanium, doped or undoped polysilicon, doped or undoped silicon wafers and patterned or non-patterned wafers, silicon on insulator (SOI), carbon doped silicon oxides, silicon nitride, doped silicon, germanium, gallium arsenide, glass, or sapphire.

Figure 6A:
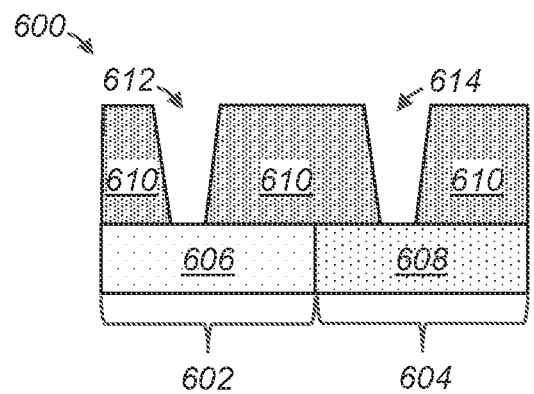
FIGS. 6A, 6B, 6C, 6D, 6E, 6F, 6G, and 6H are cross-sectional views of a portion of a semiconductor structure corresponding to various states of the method of FIG. 5.

As shown in FIG. 6A, a portion of a first transistor device 602 of a plurality of first transistor devices formed on the substrate includes a first semiconductor region 606 formed of a first material. A portion of a second transistor device 604 of a plurality of second transistor devices formed on the substrate includes a second semiconductor region 608 formed of a second material. The first and second materials include materials having differing compositions, such that the second material can be selectively etched relative to the first material (i.e., an etch rate of the second material is higher than an etch rate of the first material). The etch selectivity of the second material (i.e., a ratio of the etch rate of the second material to the etch rate of the first material) is between about 10:1 to 500:1. Example combinations of the first material and the second material include silicon (Si)/silicon germanium (SiGe), germanium (Ge)/silicon germanium (SiGe), or silicon (Si)/germanium tin (GeSn), respectively.

The first semiconductor regions 606 may be doped with n-type dopants such as phosphorus (P), antimony (Sb), with the concentration between about $10^{20}$ cm$^{-3}$ and $5\times10^{21}$ cm$^{-3}$, depending upon the desired conductive characteristic of the first transistor device 602. The second semiconductor regions 608 may be doped with p-type dopants such as boron (B) or gallium (Ga), with the concentration of between about $10^{20}$ cm$^{-3}$ and about $5\times10^{21}$ cm$^{-3}$, depending upon the desired conductive characteristic of the second transistor device 604.

The semiconductor structure 600 further includes a dielectric layer 610 having a first opening 612 formed over each of the first semiconductor regions 606 and a second opening 614 formed over each of the second semiconductor regions 608. The dielectric layer 610 may be formed of a dielectric material, such as silicon dioxide ($SiO_2$) or silicon nitride ($Si_3N_4$).

The first semiconductor regions 606 and the second semiconductor regions 608 may be formed using any suitable deposition technique, such as epitaxial (Epi) deposition, chemical vapor deposition (CVD), atomic layer deposition (ALD), or physical vapor deposition (PVD), and the openings 612 and 614 are formed by a patterning technique, such as a lithography and etch process.

The method 500 begins with a pre-clean process in block 510. The pre-clean process may be performed in a processing chamber, such as the processing chamber 122 shown in FIG. 1, or the processing chamber 200 shown in FIG. 2.

The pre-clean process is configured to remove contaminants, such as native oxide layers, or patterning residues (e.g., fluorocarbons) formed on the exposed surface of the first semiconductor region 606 within the first opening 612 and the exposed surface of the second semiconductor region 608 within the second opening 614. The pre-clean process is used to prepare the exposed surface of the first semiconductor region 606 within the first opening 612 and the exposed surface of the second semiconductor region 608 within the second opening 614 on which an epitaxial layer can be formed in a subsequent epitaxial deposition process.

The pre-clean process may include an anisotropic remote plasma assisted dry etch process, such as a reactive ion etching (RIE) process, using a plasma formed from a gas including argon (Ar), helium (He), or a combination thereof. The plasma effluents directionally bombard and remove a remaining dielectric layer within the first opening 612 and the second opening 614.

The pre-clean process may include an isotropic plasma etching process, such as a SiCoNi™ dry chemical etching process, using a plasma formed from a gas including ammonia ($NH_3$), nitrogen trifluoride ($NF_3$), hydrogen fluoride (HF), or a combination thereof, and a carrier gas, such as nitrogen ($N_2$), hydrogen ($H_2$), or a combination thereof. The dry chemical etching process is selective for oxide layers, and thus does not readily etch silicon, germanium, or nitride layers regardless of whether the layers are amorphous, crystalline or polycrystalline. Selectivity of the dry chemical etching process for oxide versus silicon or germanium is at least about 3:1, and usually 5:1 or better, sometimes 10:1. The dry chemical etching process is also highly selective of oxide versus nitride. The selectivity of the dry chemical etching process versus nitride is at least about 3:1, usually 5:1 or better, sometimes 10:1.

The pre-clean process may include an inductively coupled plasma (ICP) etching process, using a plasma formed from a gas including chlorine ($Cl_2$) and hydrogen ($H_2$), and a carrier gas including argon (Ar) and helium (He). The ICP etching process is used to form deep ridges with smooth sidewalls in silicon.

Figure 6B:
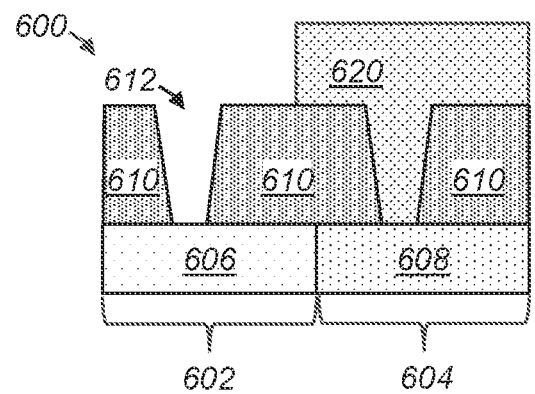

In block 520, a patterning process is performed to form a mask 620 over the second semiconductor region 608 so as to cover the exposed surface of the second semiconductor region 608 within the second opening 614, as shown in FIG. 6B. The patterning process may be performed using a conventional photolithography patterning process.

The mask 620 may be deposited onto the exposed surface of the semiconductor structure 600 using a planarizing fill process (e.g., spin-coating) and subsequently patterned by a suitable lithography and etch process. The mask 620 may be formed of organic dielectric layer (ODL), silicon anti-reflective coating (SiARC), or photoresist.

Figure 6C:
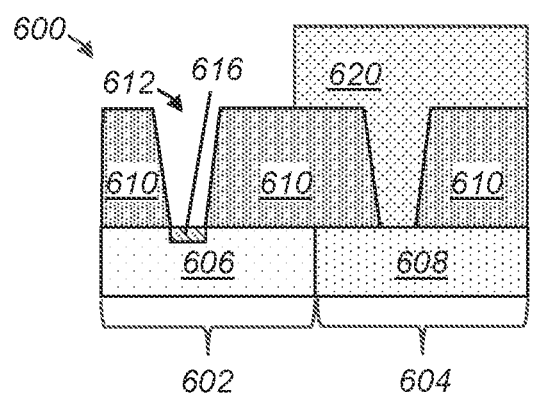

In block 530, an amorphization ion implantation process is performed to amorphize the exposed surface of the first semiconductor region 606 within the first opening 612, as shown in FIG. 6C. The amorphized surface 616 of the first semiconductor region 606 may have a depth of between about 100 Å and 150 Å.

The amorphization ion implant process in block 530 is performed by directing ions of germanium (Ge), phosphorus (P), and/or lanthanum (La), accelerated to an energy of between about 1 keV and about 5 keV, with a dose of $5\times10^{14}$ cm$^{-3}$ and $5\times10^{15}$ cm$^{-3}$, to the surface of the semiconductor structure 600.

Figure 6D:
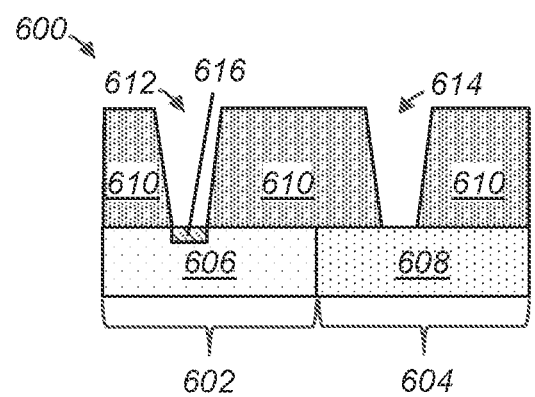

In block 540, a removal process is performed to remove the mask 620, as shown in FIG. 6D. The removal process may be a plasma ashing process performed in a processing chamber, such as the processing chamber 122 shown in FIG. 1, or the processing chamber 200 shown in FIG. 2.

The plasma ashing process can use a plasma formed from a gas including oxygen ($O_2$). The ashing process can use a wet clean process using a solution, such as a mixture of sulfuric acid ($H_2SO_4$) and hydrogen peroxide ($H_2O_2$), to remove residue of the mask 620 on the semiconductor structure 600.

Figure 6E:
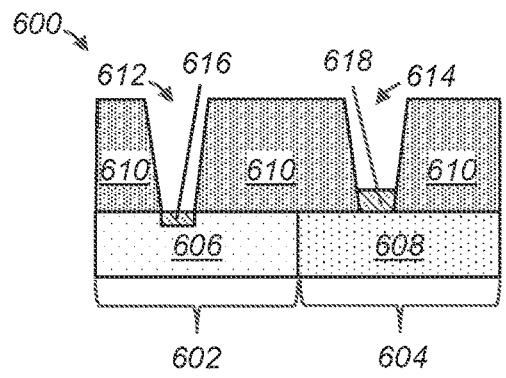

In block 550, a selective epitaxial deposition process is performed to epitaxially form a contact layer 618 on the exposed surface of the second semiconductor region 608 within the second opening 614, as shown in FIG. 6E. The selective epitaxial deposition process may be performed in a processing chamber, such as the processing chamber 126, 128, or 130 shown in FIG. 1, or the processing chamber 300 shown in FIG. 3.

The contact layer 618 is formed as interfaces between the second semiconductor region 608 and a metal contact plug to be formed within the second opening 614, to minimize parasitic resistance. The contact layer 618 is formed of a third material. Examples of the third material includes silicon germanium (SiGe) with a ratio of germanium (Ge) ranging between 20% and 100%. The contact layer 618 may be doped with p-type dopants such as boron (B) or gallium (Ga), with the concentration of between about $10^{20}$ cm$^{-3}$ and $5 \times 10^{21}$ cm$^{-3}$, depending upon the desired conductive characteristic of the contact layer 618.

In some embodiments, the selective epitaxial deposition process includes a first deposition process and a first etch process. The first deposition process is an epitaxial deposition process. The selectivity in the selective epitaxial deposition process may arise from differences in nucleation of the third material on the second semiconductor region 608 (e.g., silicon germanium (SiGe)) from that on the amorphized surface 616 of the first semiconductor region 606 (e.g., silicon (Si)) and exposed surface of the dielectric layer 610 (e.g., silicon dioxide ($SiO_2$) or silicon nitride ($Si_3N_4$)). The nucleation may occur at a faster rate on the second semiconductor region 608 (e.g., silicon germanium (SiGe)) than on the amorphized surface 616 of the first semiconductor region 606 (e.g., silicon (Si)) and the exposed surface of the dielectric layer 610 (e.g., silicon dioxide ($SiO_2$) or silicon nitride ($Si_3N_4$)), and thus an epitaxial layer of the third material may be formed selectively on the exposed surface of the second semiconductor region 608 (e.g., silicon (Si) or silicon germanium (SiGe)), while amorphous layers of the third material may be formed on the amorphized surface 616 of the first semiconductor region 606 (e.g., silicon (Si)) and the exposed surface of the dielectric layer 610 (e.g., silicon dioxide ($SiO_2$) or silicon nitride ($Si_3N_4$)), when the semiconductor structure 600 is exposed to a deposition gas in the first deposition process. In the subsequent first etch process, the amorphous layers of the third material formed on the amorphized surface 616 of the first semiconductor region 606 (e.g., silicon (Si)) and the exposed surface of the dielectric layer 610 can be etched at a faster rate than the epitaxial layer of the third material formed on the exposed surface of the second semiconductor region 608, by an appropriate etching gas. Thus, an overall result of the first deposition process and the first etch process combined can be epitaxial growth of the third material on the exposed surface of the second semiconductor region 608, while minimizing growth, if any, of the third material on the amorphized surface 616 of the first semiconductor region 606 (e.g., silicon (Si)) and the exposed surface of the dielectric layer 610.

In some embodiments, the deposition gas includes a silicon-containing precursor, a germanium containing precursor, and a dopant source. The silicon-containing precursor may include silane ($SiH_4$), disilane ($Si_2H_6$), tetrasilane ($Si_4H_{10}$), or a combination thereof. The germanium-containing precursor may include germane ($GeH_4$), germanium tetrachloride ($GeCl_4$), and digermane ($Ge_2H_6$). The dopant source may include, for example, boron, or gallium, depending upon the desired conductive characteristic of the contact layer 618. The dopant source may include a precursor diborane ($B_2H_6$). The etching gas includes an etchant gas and a carrier gas. The etchant gas may include halogen-containing gas, such as hydrogen chloride (HCl), chlorine ($Cl_2$), or hydrogen fluoride (HF). The carrier gas may include nitrogen ($N_2$), argon (Ar), helium (He), or hydrogen ($H_2$).

The first deposition process and the first etch process may be performed at a low temperature less than about 450° C. and at a pressure of between 5 Torr and 600 Torr.

A cycle of the first deposition and first etch processes may be repeated as needed to obtain a desired thickness of the contact layer 618. A thickness of the contact layer 618 may be between about 30 Å and about 100 Å.

Figure 6F:
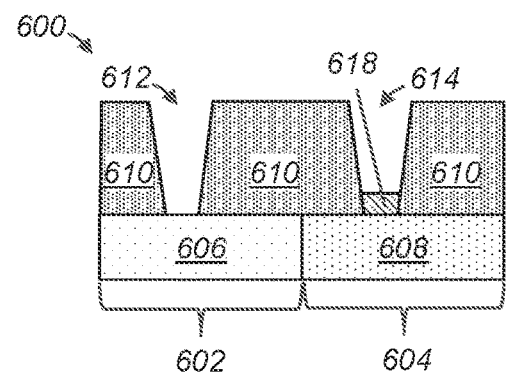

In block 560, a recrystallization anneal process is performed to recrystallize the amorphized surface 616 of the first semiconductor region 606, as shown in FIG. 6F. The recrystallization anneal process may be a spike anneal process using a rapid thermal processing (RTP) apparatus, such as the processing system 400 shown in FIG. 4.

The recrystallization anneal process may also activate dopants (e.g., p-type dopants such as boron (B) or gallium (Ga)) in the contact layer 618. The spike anneal process may be at a temperature of about 900 degrees Celsius to about 1100 degrees Celsius, such as 1000 degrees Celsius for a period of time of about 1 second to about 5 seconds.

Figure 6G:
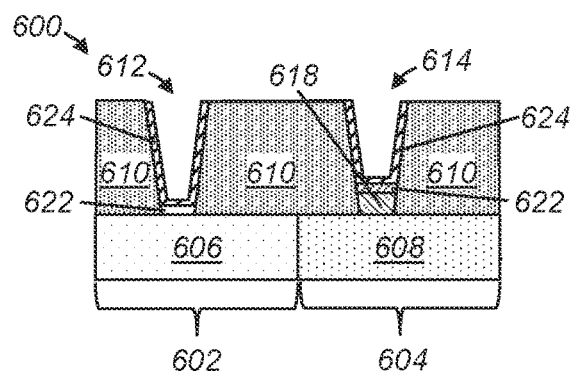

In block 570, a second deposition process is performed to form a metal layer 622 on the exposed surface of the first semiconductor region 606 and the contact layer 618, as shown in FIG. 6G. The second deposition process may be performed in a processing chamber, such as the processing chamber 126, 128, or 130 shown in FIG. 1, or the processing chamber 300 shown in FIG. 3.

The metal layer 622 contacts the contact layer 618 and provides an electrical connection between a contact plug to be formed within the second openings 614 and the second semiconductor region 608, while maintaining an electrical connection therethrough. The metal layer 622 may be formed of a metal material, such as titanium (Ti), cobalt (Co), nickel (Ni), molybdenum (Mo), or tantalum (Ta), or silicide thereof.

In some embodiments, the metal source may include a precursor that includes titanium (Ti), tantalum (Ta), cobalt (Co), nickel (Ni), or molybdenum (Mo) or combination thereof. The second deposition process may be each performed at a temperature of between about 300° C. and about 800° C. and at a pressure of between 1° Torr and 50° Torr.

In the second deposition process, a barrier metal layer 624 can also be formed on the exposed inner surfaces of the first opening 612 and the second opening 614, and the exposed surface of the dielectric layer 610. The barrier metal layer 624 protects the metal layer 622 and allows nucleation and growth of contact plugs in the first opening 612 and the second opening 614, as discussed below. The barrier metal layer 624 may be formed of a barrier metal material that is titanium nitride (TiN), or tantalum nitride (TaN). In some embodiments, the metal layer 622 is a silicide layer that is formed from a portion of the barrier metal layer 624 by use of a spike anneal process. In some other embodiments, the metal layer 622 is a silicide layer that is formed by a separate selective epitaxial deposition process that is performed before forming the barrier metal layer 624.

The second deposition process performed in block 570 may include any appropriate deposition process, such as atomic layer deposition (ALD), chemical vapor deposition (CVD), physical vapor deposition (PVD), or the like, in a processing chamber, such as the processing chamber 126, 128, or 130 shown in FIG. 1, at a temperature of between about 100° C. and about 300° C.

Figure 6H:
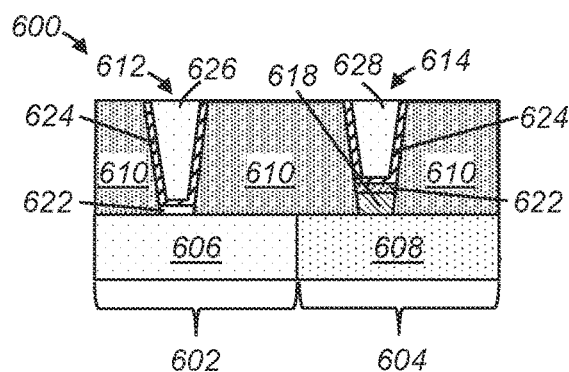

In block 580, a metal fill process is performed to form a first contact plug 626 in the first opening 612 and a second contact plug 628 in the second opening 614, as shown in FIG. 6H. The first contact plug 626 and the second contact plug 628 may be formed of contact plug metal material, such as tungsten (W), cobalt (Co), ruthenium (Ru), or molybdenum (Mo). The first contact plug 626 and the second contact plug 628 may include a metal that has a desirable work function. The metal fill process in block 570 may include a chemical vapor deposition (CVD) process using a tungsten-containing precursor, such as $WF_6$, or a cobalt-containing precursor, in a processing chamber, such as the processing chamber 126, 128, or 130 shown in FIG. 1.

After the metal fill process, the semiconductor structure 600 may be planarized, by use of a chemical mechanical planarization (CMP) process.

Figure 7:
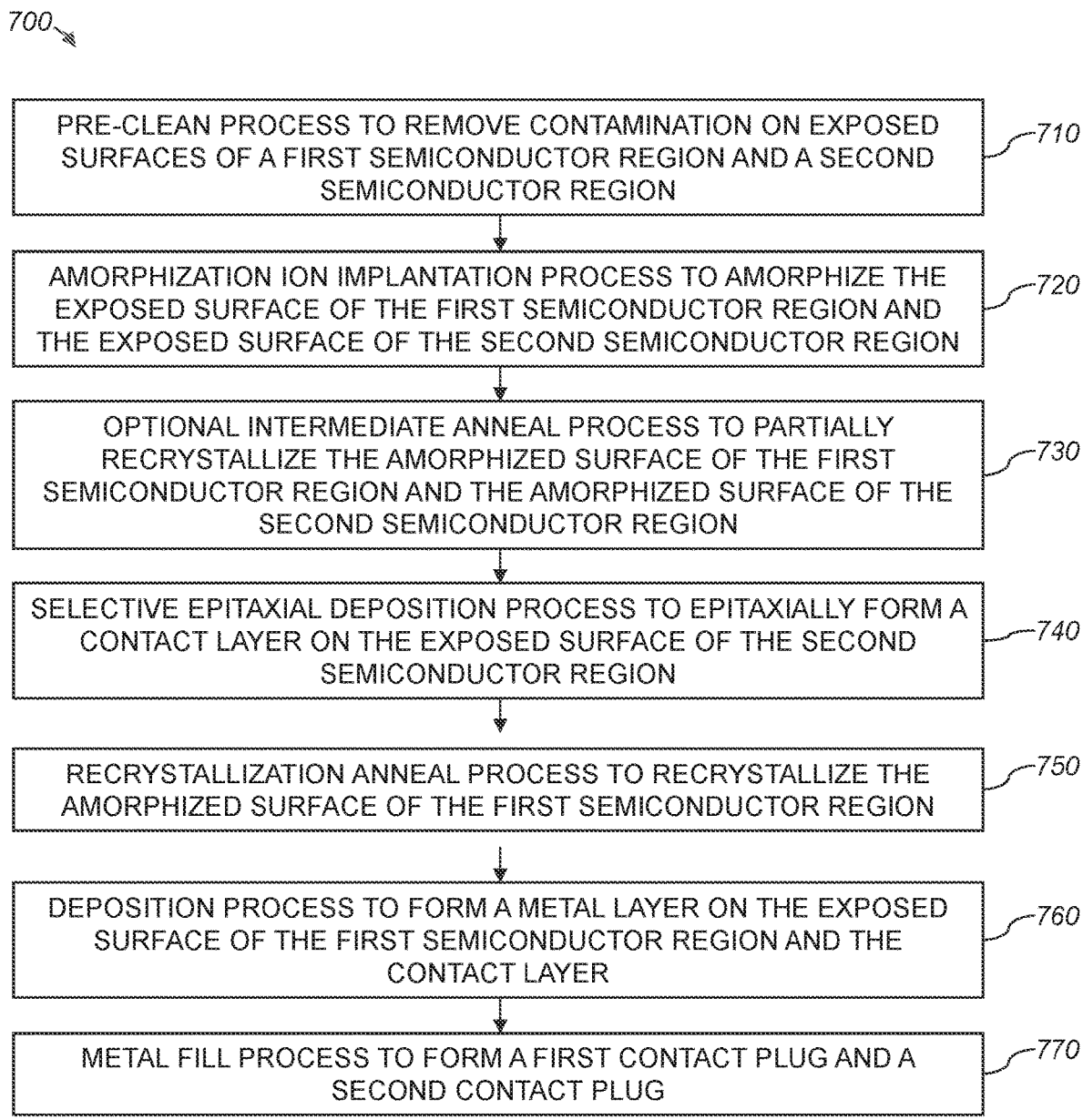
FIG. 7 depicts a process flow diagram of a method of forming a contact layer in a semiconductor structure according to a second embodiment of the present disclosure.

FIG. 7 depicts a process flow diagram of a method 700 of forming a contact layer in a semiconductor structure 800 according to a second embodiment of the present disclosure. FIGS. 8A, 8B, 8C, 8D, 8E, 8F, and 8G are cross-sectional views of a portion of the semiconductor structure 800 corresponding to various states of the method 700. It should be understood that FIGS. 8A, 8B, 8C, 8D, 8E, 8F, and 8G illustrate only partial schematic views of the semiconductor structure 800, and the semiconductor structure 800 may contain any number of transistor sections and additional materials having aspects as illustrated in the figures. It should also be noted that although the method illustrated in FIG. 7 is described sequentially, other process sequences that include one or more operations that have been omitted and/or added, and/or has been rearranged in another desirable order, fall within the scope of the embodiments of the disclosure provided herein. In the following description, the same reference numerals are used for the components that are substantially the same as those of the first embodiment, and the description of repeated components may be omitted.

The method 700 begins with a pre-clean process in block 710. The pre-clean process in block 710 is generally the same as the pre-clean process in block 510.

Figure 8A:
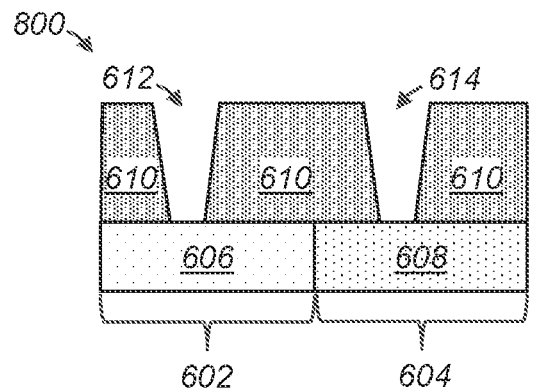
FIGS. 8A, 8B, 8C, 8D, 8E, 8F, and 8G are cross-sectional views of a portion of the semiconductor structure corresponding to various states of the method of FIG. 7.
Figure 8B:
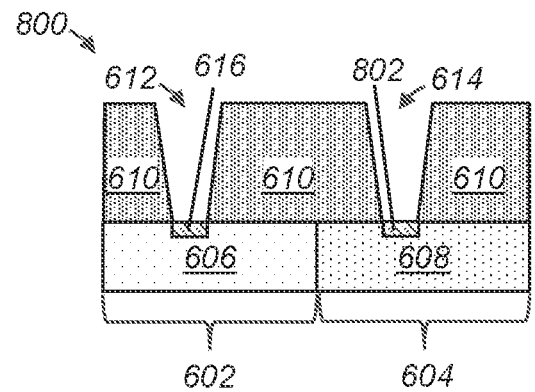

In block 720, an amorphization ion implantation process is performed to amorphize the exposed surface of the first semiconductor region 606 within the first opening 612 and the exposed surface of the second semiconductor region 608 within the second opening 614, as shown in FIG. 8B. The amorphized surface 616 of the first semiconductor region 606 and the amorphized surface 802 of the second semiconductor region 608 may have a depth of between about 100 Å and 150 Å. The amorphization ion implantation process in block 710 is generally the same as the amorphization ion implantation process in block 530.

Figure 8C:
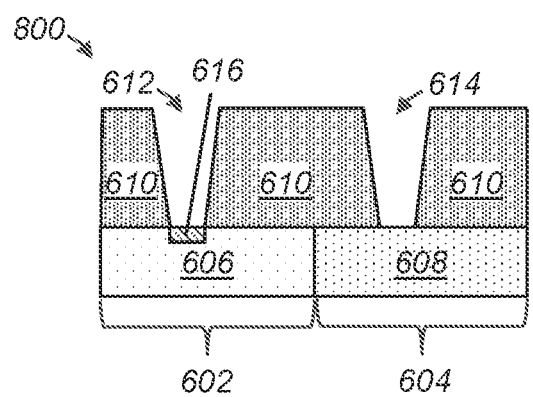

In block 730, an optional intermediate anneal process is performed to partially recrystallize the amorphized surface 616 of the first semiconductor region 606 and the amorphized surface 802 of the second semiconductor region 608, as shown in FIG. 8C. Due to a difference in recrystallization rates of the first material (e.g., silicon (Si)) of the first semiconductor region 606 and the second material (e.g., silicon germanium (SiGe)) of the second semiconductor region 608, the amorphized surface 802 of the second semiconductor region 608 may be recrystallized while the amorphized surface 616 of the first semiconductor region 606 remains amorphous.

The optional intermediate anneal process may be a spike anneal process using a rapid thermal processing (RTP) apparatus, such as the processing system 400 shown in FIG. 4.

The spike anneal process may be at a temperature of about 900 degrees Celsius to about 1100 degrees Celsius, such as 1000 degrees Celsius for a period of time of about 1 second to about 5 seconds.

Figure 8D:
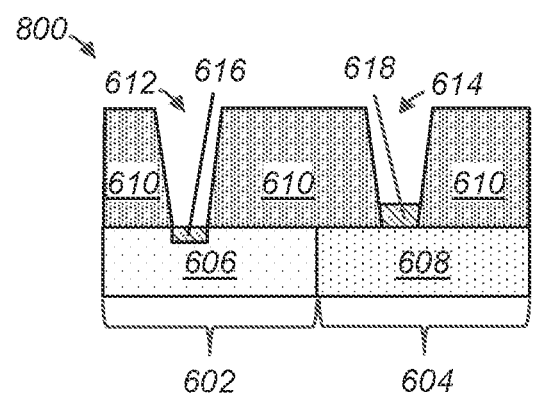

In block 740, a selective epitaxial deposition process is performed to epitaxially form a contact layer 618 on the exposed surface of the second semiconductor region 608 within the second opening 614, as shown in FIG. 8D. The selective epitaxial deposition process in block 740 is generally the same as the selective epitaxial deposition process in block 550.

The selective epitaxial deposition process in block 740 also includes a first deposition process and a first etch process. In the first etch process, the amorphized surface 802 of the second semiconductor region 608 (e.g., silicon germanium (SiGe)), if remained in block 760 or block 760 is omitted, can be etched at a faster rate than the amorphized surface 616 of the first semiconductor region 606 (e.g., silicon (Si)). Thus, the first deposition process allows a selective epitaxial growth of the third material on the surface of the second semiconductor region 608 within the second opening 614 over the surface of the amorphized surface 616 of the first semiconductor region 606. Thus, an overall result of the first deposition process and the first etch process combined can be epitaxial growth of the third material on the exposed surface of the second semiconductor region 608, while minimizing growth, if any, of the third material on the amorphized surface 616 of the first semiconductor region 606 (e.g., silicon (Si)) and the exposed surface of the dielectric layer 610.

Figure 8E:
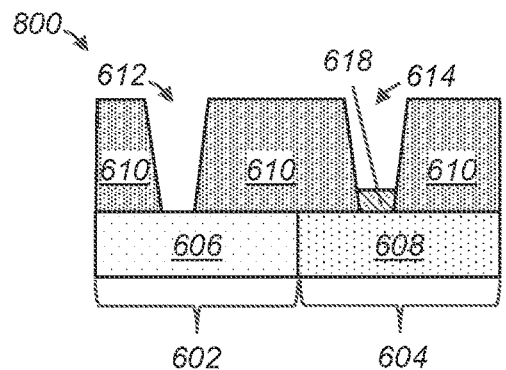

In block 750, a recrystallization anneal process is performed to recrystallize the amorphized surface 616 of the first semiconductor region 606, as shown in FIG. 8E. The recrystallization anneal process in block 750 is generally the same as the recrystallization anneal process in block 560.

Figure 8F:
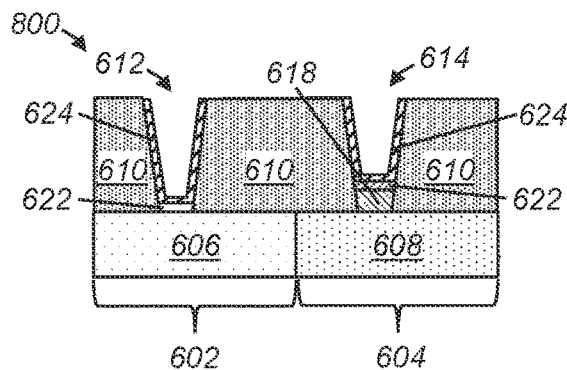

In block 760, a second deposition process is performed to form a metal layer on the exposed surface of the first semiconductor region 606 and the contact layer 618, as shown in FIG. 8F. The second deposition process in block 760 is generally the same as the second deposition process in block 570.

Figure 8G:
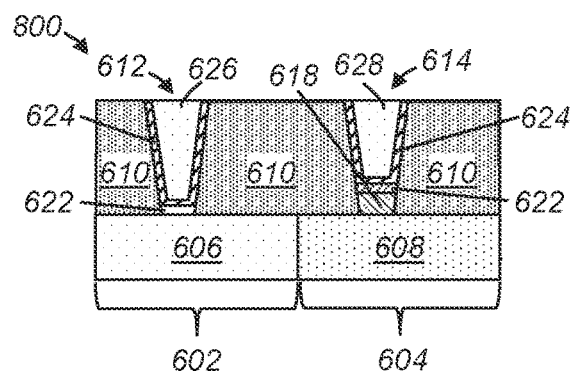

In block 770, a metal fill process is performed to form a first contact plug 626 in the first opening 612 and a second contact plug 628 in the second opening 614, as shown in FIG. 8G. The metal fill process in block 580 is generally the same as the metal fill process in block 580.

Figure 9:
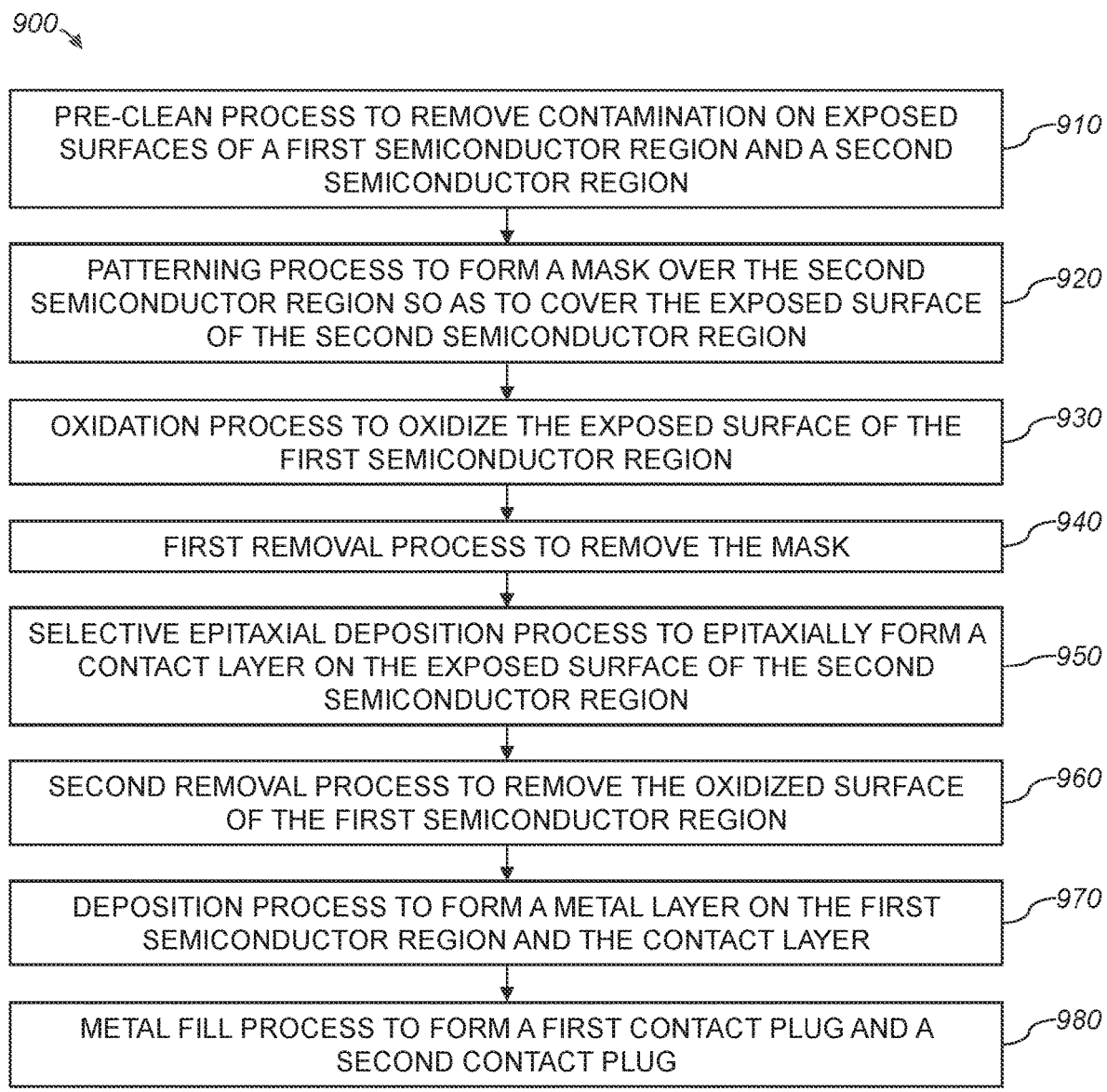
FIG. 9 depicts a process flow diagram of a method of forming a contact layer in a semiconductor structure according to a third embodiment of the present disclosure.

FIG. 9 depicts a process flow diagram of a method 900 of forming a contact layer in a semiconductor structure 1000 according to a third embodiment of the present disclosure. FIGS. 10A, 10B, 10C, 10D, 10E, 10F, 10G, and 10H are cross-sectional views of a portion of the semiconductor structure 1000 corresponding to various states of the method 900. It should be understood that FIGS. 10A, 10B, 10C, 10D, 10E, 10F, 10G, and 10H illustrate only partial schematic views of the semiconductor structure 1000, and the semiconductor structure 1000 may contain any number of transistor sections and additional materials having aspects as illustrated in the figures. It should also be noted that although the method illustrated in FIG. 9 is described sequentially, other process sequences that include one or more operations that have been omitted and/or added, and/or has been rearranged in another desirable order, fall within the scope of the embodiments of the disclosure provided herein. In the following description, the same reference numerals are used for the components that are substantially the same as those of the first embodiment, and the description of repeated components may be omitted.

The method 900 begins with a pre-clean process in block 910. The pre-clean process in block 910 is generally the same as the pre-clean process in block 510.

Figure 10A:
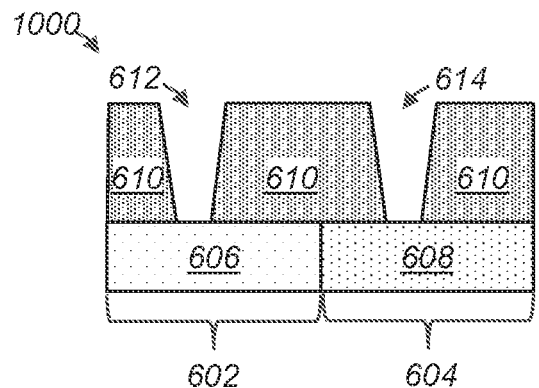
FIGS. 10A, 10B, 10C, 10D, 10E, 10F, 10G, and 10H are cross-sectional views of a portion of the semiconductor structure corresponding to various states of the method of FIG. 9.
Figure 10B:
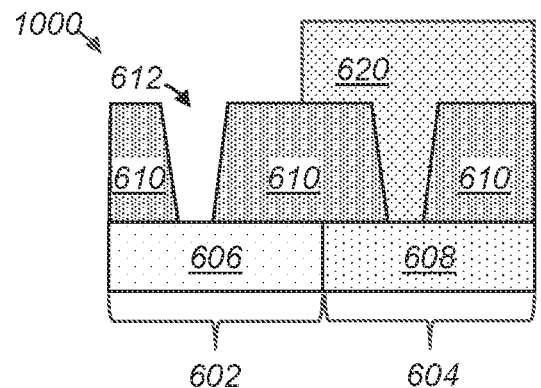

In block 920, a patterning process is performed to form a mask 620 over the second semiconductor region 608 so as to cover the exposed surface of the second semiconductor region 608 within the second opening 614, as shown in FIG. 10B. The patterning process in block 920 is generally the same as the patterning process in block 520.

Figure 10C:
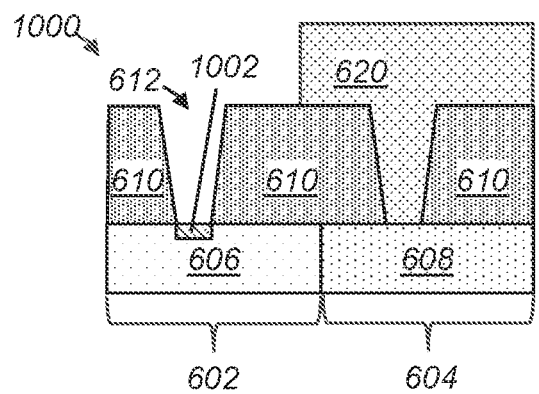

In block 930, an oxidation process is performed to oxidize the exposed surface of the first semiconductor region 606 within the first opening 612, as shown in FIG. 10C. The oxidized surface 1002 of the first semiconductor region 606 may have a depth of between about 10 Å and about 50 Å.

The oxidation process may be a direct plasma oxidation process in a processing system, such as the processing system 400 shown in FIG. 4. In a direct plasma oxidation process, oxygen plasma ions are directed to the surface of the first semiconductor region 606. In some embodiments, the direct plasma oxidation process may use an oxidizing agent including oxygen ($O_2$), nitric oxide (NO), nitrous oxide ($N_2O$), or the like. These may be used alone or in a combination thereof. Further, the direct plasma oxidation process may use a source gas for generating plasma including helium (He), argon (Ar), and/or xenon (Xe), among others. These may be used alone or in a combination thereof. In some embodiments, the direct plasma oxidation process may allow an oxidation reaction at a temperature above about 400° C. to ensure high quality of the oxidized silicon.

Figure 10D:
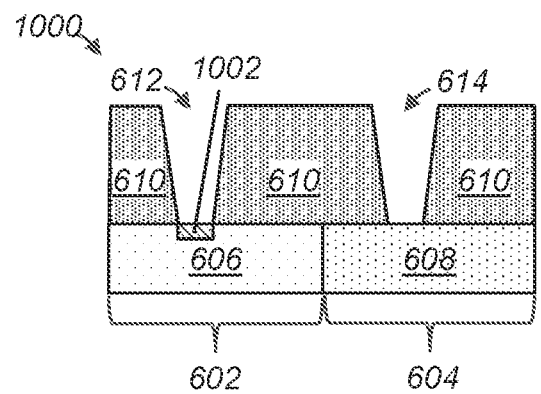

In block 940, a first removal process is performed to remove the mask 620, as shown in FIG. 10D. The removal process in block 940 is generally the same as the removal process in block 540.

Figure 10E:
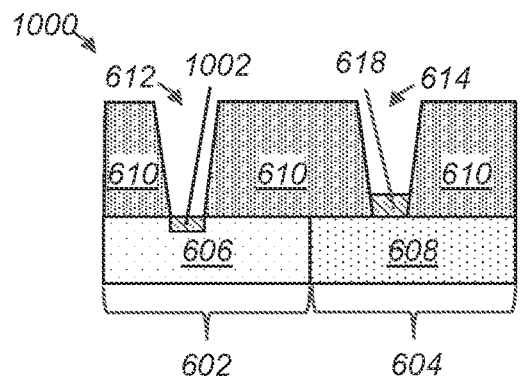

In block 950, a selective epitaxial deposition process is performed to epitaxially form a contact layer 618 on the exposed surface of the second semiconductor region 608 within the second opening 614, as shown in FIG. 10E. The selective epitaxial deposition process in block 940 is generally the same as the selective epitaxial deposition process in block 550. The selectivity in the selective epitaxial deposition process may arise from differences in nucleation of the third material on the second semiconductor region 608 (e.g., silicon germanium (SiGe)) from that on the oxidized surface 1002 of the first semiconductor region 606 (e.g., silicon (Si)) and exposed surface of the dielectric layer 610 (e.g., silicon dioxide ($SiO_2$) or silicon nitride ($Si_3N_4$)).

Figure 10F:
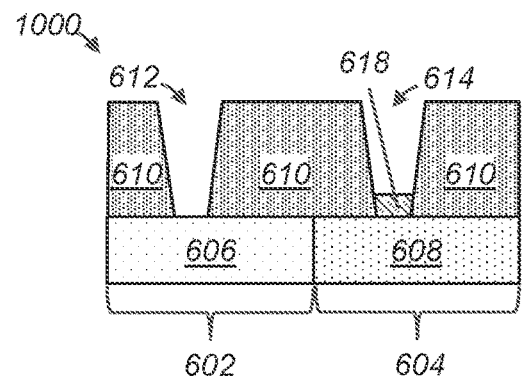

In block 960, a second removal process is performed to remove the oxidized surface 1002 of the first semiconductor region 606 (e.g., silicon (Si)), as shown in FIG. 10F.

Figure 10G:
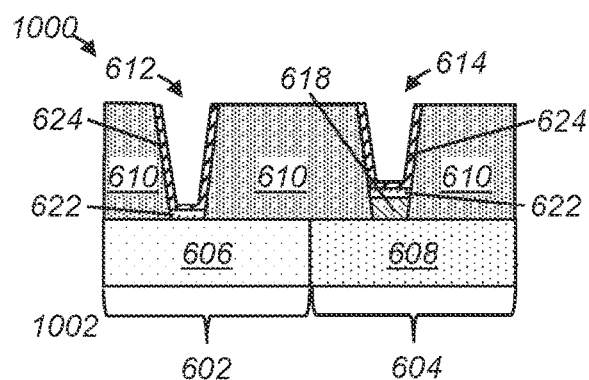

In block 970, a second deposition process is performed to form a metal layer on exposed surfaces of the first semiconductor region 606 and the contact layer 618 within the first opening 612, as shown in FIG. 10G. The second deposition process in block 960 is generally the same as the second deposition process in block 570.

Figure 10H:
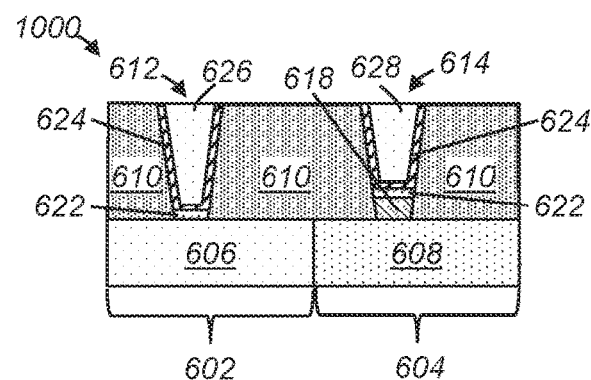

In block 980, a metal fill process is performed to form a first contact plug 626 in the first opening 612 and a second contact plug 628 in the second opening 614, as shown in FIG. 10H. The metal fill process in block 580 is generally the same as the metal fill process in block 580.

The embodiments described herein provide methods and system for forming a contact epitaxial layer within a trench on a selected portion of a transistor structure. The contact trench structure includes a metal contact plug formed within a trench between adjacent device modules, and contacts that interface between the contact plug and silicon-based channels in the device modules. The contacts are formed by a selective epitaxial deposition process, reducing parasitic resistance. The metal contact plug is formed void-free by a deposition-etch-deposition process, reducing contact resistance. The contact epitaxial layer may be p-type silicon germanium formed on an exposed surface of a p-type MOS device (e.g., silicon germanium) while no epitaxial layer may be formed on an n-type MOS (e.g., silicon) or a dielectric layer formed over the p-type MOS device and the n-type MOS device. The methods and systems do not require a patterning of an epitaxial layer using a photomask, and thus damages on a fabricated semiconductor structures are reduced.

While the foregoing is directed to embodiments of the present disclosure, other and further embodiments of the disclosure may be devised without departing from the basic scope thereof, and the scope thereof is determined by the claims that follow.

The invention claimed is:

1. A method of forming an electrical contact in a semiconductor structure, comprising:
   performing a patterning process to form a mask on a semiconductor structure, the semiconductor structure comprising a first semiconductor region, a second semiconductor region, a dielectric layer having a first opening over the first semiconductor region and a second opening over the second semiconductor region, wherein the mask covers an exposed surface of the second semiconductor region within the second opening;
   performing an amorphization ion implant process to amorphize an exposed surface of the first semiconductor region within the first opening;
   performing a removal process to remove the mask;
   performing a selective epitaxial deposition process, to epitaxially form a contact layer on the exposed surface of the second semiconductor region; and
   performing a recrystallization anneal process to recrystallize the amorphized surface of the first semiconductor region.

2. The method of claim 1, wherein
   the first semiconductor region comprises silicon doped with n-type dopants,
   the second semiconductor region comprises silicon germanium doped with p-type dopants, and
   the contact layer comprises silicon germanium doped with p-type dopants.

3. The method of claim 1, wherein
   the mask comprises material selected from organic dielectric layer, silicon anti-reflective coating, and photoresist.

4. The method of claim 1, wherein
   the removal process comprises a plasma ashing process.

5. The method of claim 1, further comprising:
   prior to the patterning process, performing a pre-clean process on the exposed surface of the first semiconductor region and the exposed surface of the second semiconductor region.

6. The method of claim 1, further comprising:
   subsequent to the recrystallization anneal process, performing a deposition process to form a metal layer on the exposed surface of the first semiconductor region and the exposed surface of the contact layer formed on the second semiconductor region.

7. The method of claim 6, wherein
the metal layer comprises material selected from titanium (Ti) silicide, cobalt (Co) silicide, nickel (Ni) silicide, molybdenum (Mo) silicide, and tantalum (Ta) silicide.

* * * * *